(12) United States Patent
Ning et al.

(10) Patent No.: US 9,267,076 B2
(45) Date of Patent: Feb. 23, 2016

(54) MULTI-BANDGAP SEMICONDUCTOR STRUCTURES AND METHODS FOR USING THEM

(71) Applicants: Cun-Zheng Ning, Chandler, AZ (US); Zhicheng Liu, Tempe, AZ (US); Leijun Yin, Tempe, AZ (US); Fan Fan, Tempe, AZ (US); Hao Ning, Wappingers Falls, NY (US); Sunay Turkdogan, Mesa, AZ (US); Patricia L. Nichols, Columbus, OH (US)

(72) Inventors: Cun-Zheng Ning, Chandler, AZ (US); Zhicheng Liu, Tempe, AZ (US); Leijun Yin, Tempe, AZ (US); Fan Fan, Tempe, AZ (US); Hao Ning, Wappingers Falls, NY (US); Sunay Turkdogan, Mesa, AZ (US); Patricia L. Nichols, Columbus, OH (US)

(73) Assignee: ARIZONA BOARD OF REGENTS, A BODY CORPORATE OF THE STATE OF ARIZONA ACTING FOR AND ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 14/396,344

(22) PCT Filed: Mar. 14, 2013

(86) PCT No.: PCT/US2013/031313
§ 371 (c)(1),
(2) Date: Oct. 22, 2014

(87) PCT Pub. No.: WO2013/184203
PCT Pub. Date: Dec. 12, 2013

(65) Prior Publication Data
US 2015/0092806 A1 Apr. 2, 2015

Related U.S. Application Data

(60) Provisional application No. 61/636,942, filed on Apr. 23, 2012.

(51) Int. Cl.
*C09K 11/88* (2006.01)
*H01S 3/0941* (2006.01)
(Continued)

(52) U.S. Cl.
CPC ............ *C09K 11/88* (2013.01); *H01S 3/0941* (2013.01); *H01S 3/169* (2013.01); *H01S 5/041* (2013.01);
(Continued)

(58) Field of Classification Search
CPC ...... C09K 11/88; B82Y 20/00; H01S 3/0941; H01S 3/169; H01S 5/021; H01S 5/041; H01S 5/10; H01S 5/101; H01S 5/1039; H01S 5/1042; H01S 5/327; H01S 5/4087
USPC ............ 372/8, 39, 43.01, 44.01, 50.1, 50.121
See application file for complete search history.

(56) References Cited

U.S. PATENT DOCUMENTS

| 6,996,147 B2 | 2/2006 | Majumdar et al. |
| 2004/0179566 A1 | 9/2004 | El-Bahar |

(Continued)

FOREIGN PATENT DOCUMENTS

WO 2011/123257 10/2011

OTHER PUBLICATIONS

A Neumann et al., "Four-color laser white illuminant demonstrating high color-rendering quality" Optics Express vol. 19 No. S4 A982-A990 (2011).
(Continued)

*Primary Examiner* — Dung Nguyen
(74) *Attorney, Agent, or Firm* — McDonnell Boehnen Hulbert & Berghoff LLP

(57) ABSTRACT

Described herein are multi-segmented nanowires, nanosheets and nanobelts, and devices and methods using them for the generation of multicolor and white light.

18 Claims, 20 Drawing Sheets

(51) Int. Cl.
  *H01S 3/16* (2006.01)
  *H01S 5/04* (2006.01)
  *H01S 5/327* (2006.01)
  *H01S 5/40* (2006.01)
  *B82Y 20/00* (2011.01)
  *H01L 33/24* (2010.01)
  *H01S 5/02* (2006.01)
  *H01S 5/10* (2006.01)

(52) U.S. Cl.
  CPC ............. *H01S 5/101* (2013.01); *H01S 5/1042* (2013.01); *H01S 5/327* (2013.01); *H01S 5/4087* (2013.01); *B82Y 20/00* (2013.01); *H01L 33/24* (2013.01); *H01S 5/021* (2013.01); *H01S 5/10* (2013.01); *H01S 5/1039* (2013.01); *H01S 5/4093* (2013.01); *Y10S 977/951* (2013.01)

(56) References Cited

U.S. PATENT DOCUMENTS

| | | |
|---|---|---|
| 2006/0050749 A1 | 3/2006 | Setzler |
| 2011/0141546 A1* | 6/2011 | Mathai et al. ................. 359/290 |
| 2011/0254052 A1 | 10/2011 | Kouvetakis et al. |
| 2011/0272744 A1 | 11/2011 | Ning et al. |
| 2011/0297846 A1* | 12/2011 | Wang ........................ 250/459.1 |
| 2011/0316043 A1 | 12/2011 | Kouvetakis et al. |
| 2012/0205613 A1 | 8/2012 | Mi et al. |
| 2012/0318324 A1 | 12/2012 | Ning et al. |

OTHER PUBLICATIONS

F Gu et al., "Spatial Bandgap Engineering along Single Alloy Nanowires", J. Am. Chem. Soc., 133, 2037-2039 (2011).
Z Yang et al., "On-Nanowire Spatial Band Gap Design for White Light Emission", Nano Letters, 11, 5085-5089 (2011).
CM Lieber, "Development and Applications of Nanowire Photonics", AFRL Final Report AFRL-SR-AR-TR-06-0093 (2006).
AM Morales et al, "A Laser Ablation Method for the Synthesis of Crystalline Semiconductor Nanowires", Science, vol. 279, pp. 208-211 (1998).
W Guo et al., "Catalyst-Free InGaN/GaN Nanowire Light Emitting Diodes Grown on (001) Silicon by Molecular Beam Epitaxy", Nano Letters, 10, 3355-3359 (2010).
K Seo et al., "Tunable-white-light-emitting nanowire sources", Nanotechnology 21 255201 (2010).
HPT Nguyen et al., "p-Type Modulation Doped InGaN/GaN Dot-in-a-Wire White-Light-Emitting Diodes Monolithically Grown on Si(111)", Nano Letters, 11, 1919-1924, (2011).
H-W Lin et al., "InGaN/GaN nanorod array white light-emitting diode", Applied Physics Letters 97, 073101 (2010).
A Pan et al., "Color-Tunable Photoluminescence of Alloyed $CdS_xSe_{1-x}$ Nanobelts", J. Am Chen. Soc., 127, 15692-15693 (2005).
A Pan et al., "Quaternary Alloy Semiconductor Nanobelts with Bandgap Spanning the Entire Visible Spectrum", J. Am Chen. Soc., 131, 9502-9503 (2009).
A Pan et al., "Color-Changeable Optical Transport through Se-Doped CdS 1D Nanostructures", Nano Letters, vol. 7, No. 10, 2970-2975 (2007).
X Duan et al., "General Synthesis of Compound Semiconductor Nanowires", Advanced Materials, 12, No. 4, pp. 298-302 (2000).
F Qian et al, "Multi-quantum-well nanowire heterostructures for wavelength-controlled lasers", Nature Materials vol. 7, pp. 701-706 (2008).
AI Persson et al., "$InAs(1-x)P(x)$ Nanowires for Device Engineering", Nano Letters, vol. 6, No. 3, 403-407 (2006).
B Tian et al., "Single nanowire photovoltaics", Chem. Soc. Rev. 38, 16-24 (2009).
A Dong et al., "Solution-Liquid-Solid (SLS) Growth of ZnSe—ZnTe Quantum Wires having Axial Heterojunctions", Nano Letters, vol. 7, No. 5, 1308-1313 (2007).
A Pan et al., "Continuous Alloy-Composition Spatial Grading and Superbroad Wavelength-Tunable Nanowire Lasers on a Single Chip", Nano Letters, vol. 9, No. 2, 784-788 (2009).
Y Liu et al., Wavelength-Controlled Lasing in $Zn(x)Cd(1-x)S$ Single-Crystal Nanoribbons, Advanced Materials, 17, 1372-1377 (2005).
A Pan et al., "Spatial Composition Grading of Quaternary ZnCdSSe Alloy Nanowires with Tunable Light Emission between 350 and 710 nm on a Single Substrate", ACS Nanon vol. 4, No. 2, 671-680 (2010).
SR Hong, International search report and written opinion for PCT/US2013/031313, mailed Dec. 26, 2013.

* cited by examiner

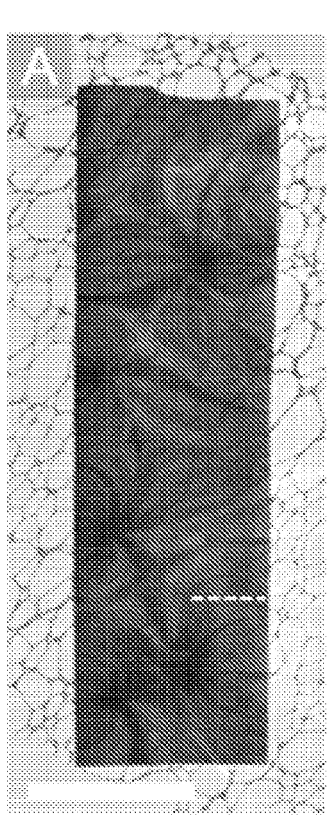
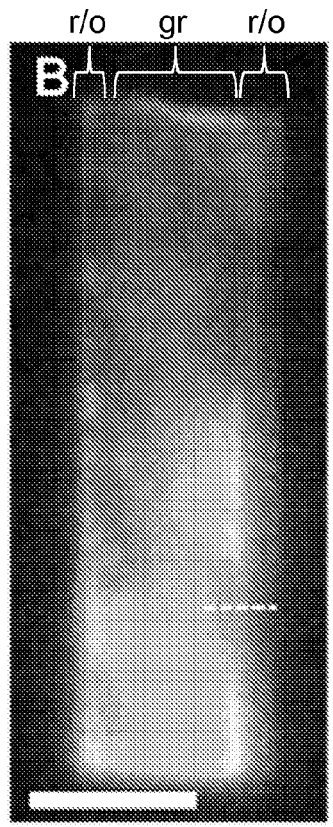
FIG. 14A                FIG. 14B
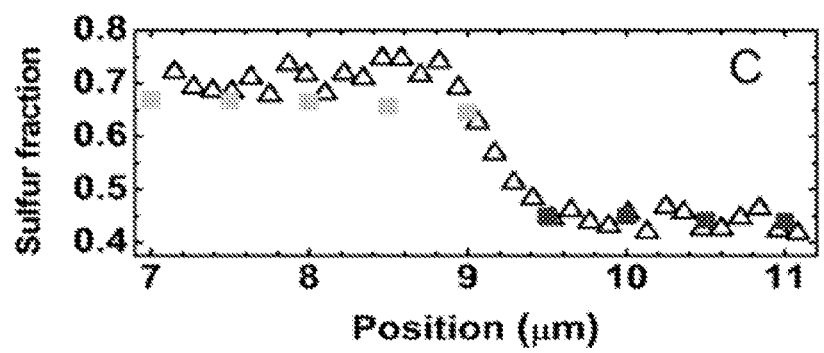
FIG. 14C

MULTI-BANDGAP SEMICONDUCTOR STRUCTURES AND METHODS FOR USING THEM

CROSS-REFERENCE TO RELATED APPLICATIONS

This application is a U.S. National Phase of International Application No. PCT/US2013/031313, filed Mar. 14, 2013, which claims priority to U.S. Provisional Application No. 61/636,942, filed Apr. 23, 2012, the disclosures of which are hereby incorporated by reference in their entireties.

STATEMENT OF GOVERNMENT INTEREST

The invention was made with government support under W911NF-08-1-0471 awarded by the Army Research Office. The Government has certain rights in the invention.

FIELD OF THE INVENTION

The invention relates generally to multi-bandgap semiconductor structures and their use in light emitting devices, such as multicolor and white lasers. The invention relates more particularly to nanowires, nanobelts and nanosheets having multiple semiconductor compositions along one or more directions thereof, and their use in the emission of light.

BACKGROUND OF THE INVENTION

Alloying two semiconductors of different bandgaps generally results in a semiconductor of bandgap different from that of either original constituent. Varying the relative compositions of the two constituents will lead to the corresponding change in bandgap. This has long been one of the standard methods of achieving a bandgap (and thus the operating wavelength of an optical device) that is not provided by naturally-occurring semiconductors. Unfortunately, this method of achieving wavelength variability is severely limited by existing methods of growing planar epitaxial heterostructures of semiconductor thin films on a crystalline substrate. Such methods invariably require a close match of lattice constants of the substrate and the materials to be grown (or a means of relieving the strain due to lattice mismatch). The very limited lattice constant mismatch required for growing high quality wafers has been the main obstacle of making semiconductor-based optoelectronic devices (such as lasers, detectors, multicolor detectors and solar cells) with controllable and widely variable (or tunable) operating wavelengths. With the advent of nanowire based technology, such restrictions are removed or are very much relaxed, depending on the method of growth. For epitaxial growth of nanowires, the relaxed requirement of lattice matching has led to the growth of materials with a mismatch as large as 8%. InP, GaAs, and other III-V nanowires have been epitaxially grown on Si (see, Martensson et al., Nano Lett. 4, 1987-1990 (2004)) and InAs and InP nanowires have been grown into nanowire heterostructures (see, Bjork et al., Nano Lett. 2, 87-89 (2002)) despite large lattice mismatches. In addition, nanowires can also be grown using an amorphous substrate as simply a mechanical support, allowing alloy nanowire growth with a much larger range of composition variation than is possible with planar growth technologies.

Multicolor lasing and dynamic color-tuning in a wide spectrum range are critically important in many areas of technology and daily life, such as general lighting, display, multicolor detection, and multi-band communication. Multicolor laser sources have an extremely wide range of applications including color display, general lighting, biological detection, holographic imaging and 3-D projection. Color display itself is important in many aspects of technology and daily life. One important advantage of multicolor lasers for color display is the more widely available color range, or color gamut, compared to the currently existing display technologies based on incoherent sources, such as cathode ray tube (CRT) and organic light emitting diode (OLED). The large spectral linewidth of incoherent light sources degrades the color purity and leads to a small color gamut. As coherent light sources, multicolor lasers render high purity monochromic colors and thus can extend the color range significantly if proper wavelengths are chosen. For lighting and illumination applications, the combination of four separate lasers with specifically selected wavelengths can achieve the large chromaticity range and similar color rendering ability as state-of-the-art LEDs or phosphors, even though lasers contain only a series of narrow emission lines. For many of the above applications that require high power output, multicolor lasers offer great advantages due to the much higher wall-plug efficiency than incoherent LED sources, thus leading to greater energy efficiency. While the importance of multicolor lasers and dynamical color control has been well-recognized for a long time, the realization of such sources has been challenging due to several technology barriers.

Multicolor lasers that are necessary for all these critical applications mentioned above require color ranges with widely separated wavelengths, or even across the entire visible spectrum. Such multicolor lasers are fundamentally different from multimode lasers. A multimode laser is conventionally made of a single semiconductor and relies on cavity structure to generate multiple lasing wavelengths corresponding to various cavity modes. Since these multiple modes are all supported by the same gain material, their separation is limited within the gain bandwidth of a semiconductor, typically in the range of 1-30 nm. Such a wavelength range is smaller than usually desired for display or lighting applications. Thus, multicolor lasers require integration or monolithic growth of multiple gain materials, or semiconductor alloys of different alloy compositions. This requirement poses a formidable challenge for traditional planar epitaxial technology due to the large degree of lattice mismatch typically involved. In addition to material challenges, cavity design is also a crucial issue when multiple gain materials are involved in a single integrated structure. This is because the light emitted by the wide-gap materials will be absorbed by the narrow-gap materials. Thus lasing is typically achieved only in the longest wavelength of the structures.

Although various semiconductor alloy nanowires of different compositions have been achieved under separate growth conditions, it is both challenging and important to achieve a full-range composition variation within a single substrate in a single run of growth. To achieve fully tunable lasing within the entire composition range on a single substrate would be even more appealing and challenging.

Therefore there exists a need in the art to provide semiconductor compositions and structural assemblies which enable continuously tunable bandgap on a single substrate. Further, methods for preparing the same which enable straightforward preparation of such semiconductor structures in a single step are needed in the art.

SUMMARY OF THE INVENTION

In one aspect, the invention provides a semiconductor nanowire, nanobelt or nanosheet having a length, the semiconductor nanowire, nanobelt or nanosheet being formed from a II-VI semiconductor material system, a III-V semiconductor material system, or a IV-VI semiconductor material system, the composition of the semiconductor nanowire, nanobelt or nanosheet varying along its length. In one embodiment, the invention provides a semiconductor nanowire, nanobelt or nanosheet as described above, that includes a plurality of linearly situated segments disposed along its length, each segment having a different composition, each segment having a different band gap, the segments being arranged in order along the length of the nanowire, nanobelt or nanosheet from smallest to largest band gap along the length of the nanowire, nanobelt or nanosheet.

In another aspect, the invention provides a method of generating radiation, the method including directing energy (e.g., through optical pumping or electrical injection) at a semiconductor nanowire, nanobelt or nanosheet as described herein at a first position thereof, the energy being adapted to pump the semiconductor material of the nanowire, nanobelt or nanosheet at the first position thereof. In certain embodiments, the method further includes substantially simultaneously directing energy at the semiconductor nanowire, nanobelt or nanosheet as described herein at a second position thereof, the energy being adapted to pump the semiconductor material of the nanowire, nanobelt or nanosheet at the first position thereof, the second position being different than the first position, the semiconductor material of the nanowire, nanobelt or nanosheet at the second position being different than the semiconductor material of the nanowire, nanobelt or nanosheet at the first position.

In another aspect, the invention provides a light emitting device comprising a semiconductor nanowire, nanobelt or nanosheet as described herein. In certain embodiments, the light emitting device includes a first energy source, configured to pump the semiconductor material of the nanowire, nanobelt or nanosheet at a first position of the nanowire. In certain embodiments, the light emitting device further includes a second energy source, configured to pump the semiconductor material of the nanowire, nanobelt or nanosheet at a second position of the nanowire, the second position being different than the first, the semiconductor material of the nanowire, nanobelt or nanosheet at the second position being different than the semiconductor material of the nanowire, nanobelt or nanosheet at the first position.

In another aspect, the invention provides a method of generating radiation, comprising directing energy as a pumping source (e.g., through optical pumping or electrical injection) at a semiconductor nanowire, nanobelt or nanosheet, the semiconductor nanowire, nanobelt or nanosheet being formed from a II-VI semiconductor material system, a III-V semiconductor material system, or a IV-VI semiconductor material system, the composition of the semiconductor nanowire, nanobelt or nanosheet varying along a dimension thereof, the energy being directed at a first position of the semiconductor nanowire, nanobelt or nanosheet, the energy being adapted to pump the semiconductor material of the nanowire, nanobelt or nanosheet at the first position thereof. In some embodiments, the method further includes substantially simultaneously directing energy at the semiconductor nanowire, nanobelt or nanosheet at a second position thereof, the energy being adapted to pump the semiconductor material of the nanowire, nanobelt or nanosheet at the first position thereof, the second position being different than the first position, the semiconductor material of the nanowire, nanobelt or nanosheet at the second position being different than the semiconductor material of the nanowire, nanobelt or nanosheet at the first position.

In another aspect, the invention provides a light emitting device comprising a semiconductor nanowire, nanobelt or nanosheet, the semiconductor nanowire, nanobelt or nanosheet being formed from a II-VI semiconductor material system, a III-V semiconductor material system, or a IV-VI semiconductor material system, the composition of the semiconductor nanowire, nanobelt or nanosheet varying along a dimension thereof. The light emitting device can further include a first energy source, configured to pump the semiconductor material of the nanowire, nanobelt or nanosheet at a first position of the nanowire, nanobelt or nanosheet, and, in some embodiments, a second energy source, configured to pump the semiconductor material of the nanowire, nanobelt or nanosheet at a second position of the nanowire, the second position being different than the first, the semiconductor material of the nanowire, nanobelt or nanosheet at the second position being different than the semiconductor material of the nanowire, nanobelt or nanosheet at the first position.

In another aspect, a semiconductor nanowire or nanobelt formed from a II-VI semiconductor material system, a III-V semiconductor material system, or a IV-VI semiconductor material system, the composition of the semiconductor nanowire, nanobelt or nanosheet varying along a dimension thereof, wherein the bandgap emission wavelength of the semiconductor material at the first position is longer than the bandgap emission wavelength of the semiconductor material at the second position, and wherein the second position is disposed in a loop.

BRIEF DESCRIPTION OF THE DRAWINGS

FIG. 14A is a TEM image of a CdSSe laterally segmented nanosheet according to another embodiment of the invention;

FIG. 14B is a real color photoluminescence image of the nanosheet of FIG. 14A.

FIG. 14C is a plot of sulfur molar fraction between EDS scan (hollow triangles) and micro-PL scan (solid squares) along the white dashed line in FIGS. 14A and 14B.

DETAILED DESCRIPTION OF THE INVENTION

Figure 1:
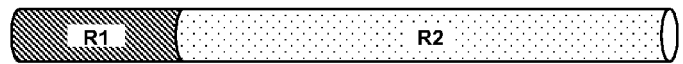
FIG. 1 is a schematic view of a nanowire according to one embodiment of the invention.

One aspect of the invention relates to a semiconductor nanowire, nanobelt or nanosheet having a length, the semiconductor nanowire, nanobelt or nanosheet being formed from a II-VI semiconductor material system, a III-V semiconductor material system, or a IV-VI semiconductor material system, the composition of the semiconductor nanowire, nanobelt or nanosheet varying along a dimension thereof (e.g., length, or, in the case of nanobelt or a nanosheet, width).

In one embodiment, the invention provides a semiconductor nanowire having a length, the semiconductor nanowire formed from a II-VI semiconductor material system, a III-V semiconductor material system, or a IV-VI semiconductor material system, the composition of the semiconductor nanowire varying along its length. The term "nanowire" as used herein means structures that have a lateral size of less than about 1000 nm (e.g., about 1-100 nm or about 200-1000 nm) and an unconstrained length. In certain embodiments, the length is in the range of about 10 μm to about 3000 μm (e.g., about 100 μm to about 1500 μm). For example, nanowires can have an aspect ratio of 1000 or more.

In another embodiment, the invention provides a semiconductor nanobelt, the semiconductor nanobelt being formed from a II-VI semiconductor material system, a III-V semiconductor material system, or a IV-VI semiconductor material system, the composition of the semiconductor nanobelt varying along its length, or across its width. The term "nanobelt" as used herein means structures that have a lateral size (width) in the range of 1 to 20 μm, the thickness less than 1000 nm, and an unconstrained length. In certain embodiments, the length is in the range of about 10 μm to about 3000 μm (e.g., about 100 μm to about 1500 μm).

In another embodiment, the invention provides a semiconductor nanosheet having a length, the semiconductor nanosheet being formed from a II-VI semiconductor material system, a III-V semiconductor material system, or a IV-VI semiconductor material system, the composition of the semiconductor nanosheet varying along its length or across its width. The term "nanosheet" as used herein means structures that have a width in the range of about 20 μm to about 3000 μm (e.g., 20 μm to about 1500 μm), thickness less than 1000 nm, and an unconstrained length. In certain embodiments, the length is in the range of about 10 μm to about 3000 μm (e.g., about 100 μm to about 1500 μm).

Herein, a notation is used to refer to semiconductor material systems having the form of two sets of elements each within its own set of parenthesis; for example, {ABCD}{EFGH}. This notation means that the material system comprises at least one element selected from A, B, C, and D, and at least one element selected from E, F, G, and H. Various compositions within the material system can have varying proportions of the elements of each set. When this notation is used in combination with the modifiers such as "binary", "ternary", "quaternary", "quinary", or "senary", among others, it means that the semiconductor composition contains a total of 2, 3, 4, 5, or even 6 elements, respectively, provided that at least one element selected from A, B, C, and D, and at least one element selected from E, F, G, and H. Compositions having more than one element from a given set are known as "alloys." For example, both $CdS_{1-y}Se_y$ and $Cd_{1-x}Hg_xS$, among others, are ternary alloys of the {CdZnHg}{SSeTe} material system.

In certain embodiments, the semiconductor nanowire, nanobelt or nanosheet is formed from a II-VI semiconductor material system. Constituent elements of II-VI semiconductor systems are selected from Groups IIA and IIB, (e.g, Cd, Zn, Hg, Mn) and VIA (e.g., S, Se, Te), of the periodic table, wherein at least one constituent element is selected from Groups IIA and/or JIB of the periodic table and at least one constituent element is selected from Group VIA of the periodic table. Examples of suitably material systems include, for example, {MnZnCd}{SSe}, {ZnCd}{SSeTe}, {ZnCd}{SSe}, and {HgCdZn}{SSeTe}. Examples of II-VI compounds and alloys include, but are not limited to (a) binary II-VI compounds (i.e., "II-VI compounds") such as, but not limited to, cadmium selenide (CdSe), cadmium sulfide (CdS), cadmium telluride (CdTe), zinc oxide (ZnO), zinc selenide (ZnSe), zinc sulfide (ZnS), and zinc telluride (ZnTe); (b) ternary alloy such as, but not limited to, cadmium zinc telluride (CdZnTe, CZT), mercury cadmium telluride (HgCdTe), mercury zinc telluride (HgZnTe), and mercury zinc selenide (HgZnSe); and (c) quaternary alloys such as, but not limited to, cadmium mercury selenide telluride (CdHgSeTe) and cadmium zinc selenide telluride (CdZnSeTe). For example, each segment can comprise an {MnZnCd}{SSe} compound or an {ZnCd}{SSe} compound, such as CdS, CdSe, CdSSe, CdZnTe, ZnCdSSe, or ZnMnSSe.

In other embodiments, the semiconductor nanowire, nanobelt or nanosheet is formed from a III-V semiconductor material system. Constituent elements of III-V semiconductor systems are selected from Groups IIIA (e.g, Al, B, Ga, In) and VA (e.g., N, P, As, Sb), of the periodic table, wherein at least one constituent element is selected from Group IIIA of the periodic table and at least one constituent element is selected from Group VA of the periodic table. Examples of suitable material systems include, for example, {AlGaIn}{AsP}. Examples of III-V compounds and alloys include, but are not limited to (a) binary alloys such as, but not limited to, Aluminum antimonide (AlSb), Aluminum arsenide (AlAs), Aluminum nitride (AlN), Aluminum phosphide (AlP), Boron nitride (BN), Boron phosphide (BP), Boron arsenide (BAs), Gallium antimonide (GaSb), Gallium arsenide (GaAs), Gallium nitride (GaN), Gallium phosphide (GaP), Indium antimonide (InSb), Indium arsenide (InAs), Indium nitride (InN), and Indium phosphide (InP); (b) ternary alloys, but not limited to, Aluminum gallium arsenide (AlGaAs), Indium gallium arsenide (InGaAs), Aluminum indium arsenide (AlInAs), Aluminum indium antimonide (AlInSb), Gallium arsenide nitride (GaAsN), Gallium arsenide phosphide (GaAsP), Aluminum gallium nitride (AlGaN), Aluminum gallium phosphide (AlGaP), Indium gallium nitride (InGaN), Indium arsenide antimonide (InAsSb), and Indium gallium antimonide (InGaSb); (c) quaternary alloys such as, but not limited to, Aluminum gallium indium phosphide (AlGaInP, also InAlGaP, InGaAlP, AlInGaP), Aluminum gallium arsenide phosphide (AlGaAsP), Indium gallium arsenide phosphide (InGaAsP), Aluminum indium arsenide phosphide (AlInAsP), Aluminum gallium arsenide nitride (AlGaAsN), Indium gallium arsenide nitride (InGaAsN), and Indium aluminum arsenide nitride (InAlAsN); and (d) quinary alloys such as, but not limited to, Gallium indium nitride arsenide antimonide (GaInNAsSb). Higher order alloys include, for example, the senary alloy Indium gallium aluminum arsenide antimonide phosphide InGaAlAsSbP.

In other embodiments, the semiconductor nanowire, nanobelt or nanosheet is formed from a IV-VI semiconductor material system. Constituent elements of IV-VI semiconductor systems are selected from Groups IVA (e.g, Ge, Sn, Pb, Tl) and VIA (e.g., S, Se, Te), of the periodic table, wherein at least one constituent element is selected from Group IVA of the periodic table and at least one constituent element is selected from Group VIA of the periodic table. Examples of suitably material systems include, for example, {GeSnPb}{SSeTe}. Examples of IV-VI compounds and alloys include, but are not limited to lead selenide, lead telluride, tin sulfide, tin telluride, lead tin telluride, thallium tin telluride and thallium germanium telluride.

In certain embodiments, the semiconductor materials are chosen such that the bandgaps of the various compositions of the nanowire, nanobelt or nanosheet fall in the range of about 1.5 eV to about 4.5 eV. For example, in one embodiment, so that they can be useful in providing visible radiation, the semiconductor materials are chosen such that the bandgaps of the various compositions of the nanowire, nanobelt or nanosheet fall in the range of about 1.77 eV (corresponding to 700 nm) to about 3.1 eV (corresponding to 400 nm). For example, for a III-V semiconductor material system, $In_xGa_{1-x}N$ can be selected to have a bandgap between about 2.0 and about 3.4 eV. In another example, for a II-VI semiconductor material system, $Zn_xCd_{1-x}S_ySe_{1-y}$ can be selected to have a bandgap between about 1.74 eV and about 3.54 eV. In another example of a II-VI semiconductor material system, $Cd_xZn_{1-x}Te$ can be selected to have a bandgap between about 1.4 eV and about 2.2 eV. The person of ordinary skill in the art will appreciate that a variety of other materials can provide bandgaps in the range of about 1.77 eV to about 3.1 eV. In certain embodiments, the difference in bandgap between at least two of the various compositions of the nanowire (e.g., of adjacent segments) is at least about 0.1 eV, at least about 0.3 eV or even at least about 0.5 eV.

In certain aspects, the semiconductor nanowire, nanobelt or nanosheet is formed from a {ZnCd}{SSe} semiconductor material system. For example, the various compositions of the nanowire, nanobelt or nanosheet can have the formula $Zn_xCd_{1-x}S_ySe_{1-y}$ wherein x and y are each greater than or equal to 0 and less than or equal to 1. In certain embodiments, both x and y are greater than 0 and less than 1. In certain such embodiments, x is about 0.001 to about 0.97. In certain embodiments, x is about 0.005 to about 0.97. In certain such embodiments, y is about 0.10 to about 0.95. In certain embodiments, y is about 0.12 to about 0.95. In certain such embodiments, y is about 0.14 to about 0.95. In certain embodiments, y is about 0.10 to about 0.92. In certain such embodiments, y is about 0.12 to about 0.92. In certain such embodiments, y is about 0.14 to about 0.92. For example, in certain embodiments, x is about 0.001 to about 0.97 and y is about 0.10 to about 0.95. In other embodiments, x is about 0.001 to about 0.97 and y is about 0.12 to about 0.95. In other embodiments, x is about 0.001 to about 0.97 and y is about 0.14 to about 0.95. In other embodiments, x is about 0.001 to about 0.97 and y is about 0.10 to about 0.92. In other embodiments, x is about 0.001 to about 0.97 and y is about 0.12 to about 0.92. In other embodiments, x is about 0.001 to about 0.97 and y is about 0.14 to about 0.92. In other embodiments, x is about 0.005 to about 0.97 and y is about 0.10 to about 0.95. In other embodiments, x is about 0.005 to about 0.97 and y is about 0.12 to about 0.95. In other embodiments, x is about 0.005 to about 0.97 and y is about 0.14 to about 0.95. In other embodiments, x is about 0.005 to about 0.97 and y is about 0.10 to about 0.92. In other embodiments, x is about 0.005 to about 0.97 and y is about 0.12 to about 0.92. In other embodiments, x is about 0.005 to about 0.97 and y is about 0.14 to about 0.92.

In another aspect, the semiconductor nanowire, nanobelt or nanosheet is formed from a {Cd}{SSe} semiconductor material system. For example, the various compositions of the nanowire, nanobelt or nanosheet can have the formula $CdS_ySe_{1-y}$ wherein y is greater than or equal to 0 and less than or equal to 1. In certain such embodiments, y is about 0.10 to about 0.95. In certain embodiments, y is about 0.12 to about 0.95. In certain such embodiments, y is about 0.14 to about 0.95. In certain embodiments, y is about 0.10 to about 0.92. In certain such embodiments, y is about 0.12 to about 0.92. In certain such embodiments, y is about 0.14 to about 0.92.

As described herein, semiconductor nanowires, nanobelts and nanosheets can be constructed with varying semiconductor compositions, so that the bandgaps of the various materials are different as desired such that each semiconductor composition emits a different, desired color upon absorption of energy corresponding to an absorption band of the semiconductor composition. The energy can be provided, for example, as optical radiation having a wavelength corresponding to an absorption band of the semiconductor composition, or can be provided through electrical injection, as is conventional in the art. Emitted light intensity corresponding to each semiconductor composition can be determined by, for example, the linear distance along the appropriate dimension of the nanowire, nanobelt or nanosheet having the composition (e.g., length or width), and the pumping strength.

In certain aspects, the semiconductor nanowire, nanobelt or nanosheet is of a form comprising a plurality of linearly situated segments disposed along a dimension thereof, each segment having a different composition, each segment having a different band gap, the segments being arranged in order along the dimension of the nanowire, nanobelt or nanosheet from smallest to largest band gap. For example, the semiconductor nanowire can include at least two linearly situated segments, or even at least three linearly situated segments. In certain embodiments, the semiconductor nanowire, nanobelt or nanosheet can include 2-10 segments; or 2-5 segments; or two segments; or three segments. In certain embodiments, the multiple segments of different compositions can be situated across the width direction of a nanobelt or nanosheet, rather than along the length direction.

Although in these embodiments the nanowires, nanobelts and nanosheets are described as "segmented," the person of ordinary skill in the art will appreciate that a transition region may exist between the segments, in which the semiconductor composition varies from the composition of one segment to the composition of the next segment. Such "transition" regions are allowable. Such transition regions can, in certain embodiments, be atomically sharp within a nanometer, or in other embodiments can be smooth over several microns. In certain embodiments, any transition region of the nanowires, nanosheet or nanobelts between segments is smaller in length than the wavelengths used in pumping and the wavelengths emitted by the nanowire, nanobelt or nanosheet. In other embodiments, any transition region between the segments of the nanowire, nanosheet or nanobelt is less than about 20 μm, less than about 10 μm, less than about 5 μm, less than about 2 μm, or less than about 1 μm in length. In certain such embodiments, any transition region is at least about 100 nm in length, at least about 200 nm in length, at least about 500 nm in length, or even at least about 1 μm in length. In certain embodiments, a transition region is desirable, in that the continuous change in material composition in the transition from one segment to the next enables high quality semiconductor materials to be grown due to the gradual composition change.

In certain embodiments as described herein, each segment of the semiconductor nanowire, nanobelt or nanosheet has a different linear measurement along the dimension (e.g., a different length, or, in the case of a nanobelt or nanosheet, a different width). Each segment can have, in certain embodiments, a linear measurement of about 10 μm to about 500 μm. For example, for a nanowire having three segments, a first segment can have a length between about 10 μm and about 20 μm, a second segment can have a length between about 50-100 μm, and a third segment can have a length between about 200-500 μm. Overall, the nanowires, nanobelts and nanosheets as described herein, in certain embodiments, can have a total linear measurement along the dimension (i.e., accounting for all segments of the nanowire and any other part of the nanowire, nanobelt or nanosheet not within the described segments) between about 300 μm and about 3000 μm.

In certain embodiments of segmented semiconductor nanowires, nanobelts or nanosheets as described herein, each segment can be formed from an II-VI semiconductor. For example, each segment can be formed from the {MnZnCd}{SSe} semiconductor material system or the {ZnCd}{SSeTe} semiconductor material system, or the {ZnCd}{SSe} semiconductor material system, e.g., from compounds such as CdS, CdSe, CdSSe, CdZnTe, ZnCdSSe, or ZnMnSSe. In another embodiment of any of the preceding, each segment can be formed from a III-V semiconductor. For example, each segment can be formed from the {AlInGa}{N} semiconductor material system, e.g., from compounds, such as, AlInGaN or InGaN. In another embodiment of any of the preceding, each segment can be formed from a IV-VI semiconductor. In certain embodiments of segmented semiconductor nanowires, nanobelts or nanosheets as described herein, each segment is of substantially uniform composition. However, in other embodiments, the composition of each segment can change somewhat over the length and/or width of the segment. In certain embodiments, the bandgap varies in each segment by less than about 0.1 eV, at least about 0.3 eV or even at least about 0.5 eV. The person of ordinary skill in the art will determine pumping conditions and looping configurations for nanowires in which the segments have varying compositions.

In certain embodiments of segmented semiconductor nanowires, nanobelts or nanosheets as described herein, the semiconductor nanowire, nanobelt or nanosheet can include two or three segments, wherein each segment is formed from the {ZnCd}{SSe} material system. For example, in one certain embodiment, the semiconductor nanowire, nanobelt or nanosheet can comprise two segments, wherein the first segment is formed from CdS and the second segment is formed from CdSe. In another embodiment, the semiconductor nanowire can comprise two segments, wherein the first segment is formed from a compound of the formula $CdS_{y1}Se_{1-y1}$ and the second segment is formed from a compound of the formula $CdS_{y2}Se_{1-y2}$, wherein y1 and y2 are each greater than 0 and less than 1, and y1 and y2 are not the same. In another embodiment, the semiconductor nanowire, nanobelt or nanosheet can include three segments, wherein each segment is formed from a compound of the formula $Zn_xCd_{1-x}S_ySe_{1-y}$, wherein x and y are each greater than equal to 0 and less than or equal to 1, and wherein the x value, the y value, or both the x and y value is different for each segment. In another embodiment, the semiconductor nanowire can comprise two segments, wherein the first segment has a band gap emission wavelength greater than or equal to 380 nm and less than or equal to 470 nm; and the second segment has a band gap emission wavelength greater than or equal to 570 nm and less than or equal to 575 nm. In another embodiment, the semiconductor nanowire can comprise three segments, wherein the first segment has a band gap emission wavelength of about 470 nm; and the second segment has a band gap emission wavelength of about 540 nm, and the third segment has a band gap emission wavelength of about 640 nm. Of course, the person of ordinary skill in the art Materials as described herein can be made using the methods described below herein, and variations of such methods. The person of skill in the art will also devise methods for making the materials described herein based on the current state of the art.

Another aspect of the invention is a semiconductor nanowire or nanobelt as described herein, disposed such that a first sublength of the nanowire or nanobelt is configured in a loop, and a second sublength of the nanowire or nanobelt is not looped. For example, a first segment of the nanobelt or nanowire can be within the looped sublength of the nanowire or nanobelt, and a different segment (e.g., a second segment, or a third segment) of the nanowire or nanobelt can be within the straight sublength of the nanowire or nanobelt. For example, in one embodiment, at least one segment of the nanowire or nanobelt is disposed in a loop and at least one segment of the nanowire or nanobelt is not looped. In another embodiment, the semiconductor nanowire or nanobelt has two segments wherein each segment of the nanowire or nanobelt is not looped. In another embodiment, the semiconductor nanowire or nanobelt has three segments wherein each segment of the nanowire or nanobelt is not looped. In another embodiment, the semiconductor nanowire or nanobelt has two segments wherein one segment of the nanowire or nanobelt is disposed in a loop and one segment of the nanowire or nanobelt is not looped. In another embodiment, the semiconductor nanowire or nanobelt has three segments wherein two segments of the nanowire or nanobelt are disposed in a loop (i.e., each in a separate loop) and one segment of the nanowire or nanobelt is not looped. In another embodiment, the semiconductor nanowire or nanobelt has three segments wherein two segments of the nanowire or nanobelt are disposed in a loop (i.e., each in a separate loop) and one segment of the nanowire or nanobelt is not looped, wherein the two looped segments are adjacent segments.

Figure 2:
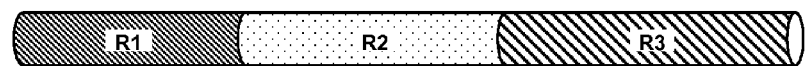
FIG. 2 is a schematic view of a nanowire according to another embodiment of the invention.

For example, FIG. 1 is a schematic view of a nanowire having two segments, R1 and R2, each having a different semiconductor composition. Each segment can be formed from, for example, a II-VI semiconductor compound, or a III-V semiconductor compound. In one particular embodiment, segments R1 and R2 are respectively formed from CdSe and CdS. As will be described in further detail below, a two-segment nanowire can be used to generate emitted radiation at two different wavelengths FIG. 2 is a schematic view of a nanowire having three segments, R1, R2 and R3, each having a different semiconductor composition. Each segment can be formed from, for example, a II-VI semiconductor compound, or a III-V semiconductor compound. In one example, segments R1, R2, and R3, are formed respectively from comprise $Zn_{x1}Cd_{1-x1}S_{y1}Se_{1-y1}$, $Zn_{x2}Cd_{1-x2}S_{y2}Se_{1-y2}$ and $Zn_{x3}Cd_{1-x3}S_{y3}Se_{1-y3}$, in which at least one of x1, x2 and x3 or y1, y2 and y3 varies among the segments. As will be described in further detail below, a three-segment nanowire can be used to generate emitted radiation at three different wavelengths.

Figure 3:
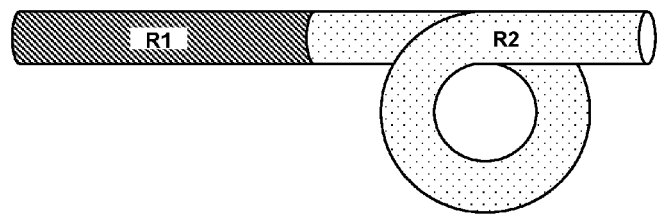
FIG. 3 is a schematic view of a nanowire including a looped segment according to one embodiment of the invention.

FIG. 3 is a schematic view of a nanowire having two segments, with the bandgap emission wavelength of segment R1 being longer than the bandgap emission wavelength of segment R2. Each segment can be formed from, for example, a II-VI semiconductor compound, or a III-V semiconductor compound. As will be described in further detail below, a looped segment design can help to reduce the loss of the short-wavelength segment, increasing the chance of lasing of short-wavelength radiation.

Figure 4:
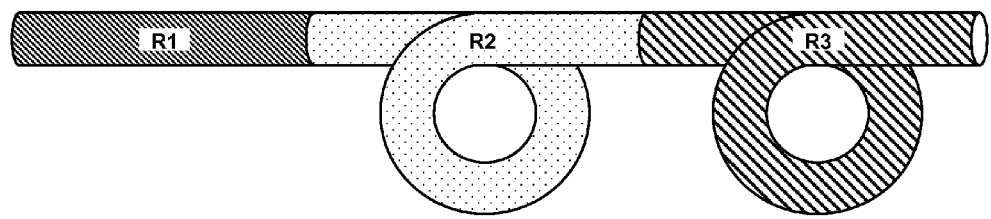
FIG. 4 is a schematic view of a nanowire including two looped segments according to another embodiment of the invention.

FIG. 4 is a schematic view of a nanowire having three segments, with the wavelength corresponding to the bandgap of segment R1 being longer than the bandgap emission wavelength of segment R2 and the bandgap emission wavelength of segment R3. In certain embodiments, the bandgap emission wavelength of segment R2 is longer than the bandgap emission wavelength of segment R3. Each segment can be formed from, for example, a II-VI semiconductor compound, or a III-V semiconductor compound. As will be described in further detail below, a looped segment design can help to reduce the loss of the short-wavelength segments, increasing the chance of lasing of short-wavelength radiation.

Segmented nanowire, nanosheet and nanobelt structures as described herein can provide access to a variety of wavelength ranges and combinations. Moreover, for use in generation of emission as described herein, the nanowire, nanobelt and nanosheet structures are advantaged in that they not only act as gain/absorbing materials, but they also provide channels for electrical conductance and waveguiding structures for optical waveguiding. Thus, the segments of the nanowires, nanobelts and nanosheets described herein can themselves form laser cavities.

Another aspect of the invention is a method for generating radiation using the nanowires, nanobelts and nanosheets as described herein. The method includes directing energy at a semiconductor nanowire, nanobelt or nanosheet as described herein at a first position thereof (for example, in a first segment thereof), the energy being adapted to pump the semiconductor material of the nanowire, nanobelt or nanosheet at the first position thereof. As the person of skill in the art will appreciate, to "pump" a semiconductor material is to direct energy at it so that the semiconductor material absorbs the energy and luminesces. As will be familiar to the person of skill in the art, pumping can be performed optically, by illuminating the material with optical radiation at a pump wavelength for the material; or electrically by electrical injection. As such techniques are well-known to the person of skill in the art, they are not described in detail here.

Accordingly, another aspect of the invention relates to a light emitting device including a semiconductor nanowire, nanobelt or nanosheet as described herein. For example, one embodiment of a light emitting device includes a semiconductor nanowire, nanobelt or nanosheet as described herein, and a first energy source, configured to pump the semiconductor material of the nanowire, nanobelt or nanosheet at a first position (for example, in a first segment thereof) of the nanowire, nanobelt or nanosheet.

In certain embodiments, the method includes substantially simultaneously directing energy at the semiconductor nanowire, nanobelt or nanosheet as described herein at a second position thereof (for example, in a second segment thereof), the energy being adapted to pump the semiconductor material of the nanowire, nanobelt or nanosheet at the second position thereof, the second position being different than the first position, the semiconductor material of the nanowire, nanobelt or nanosheet at the second position being different than the semiconductor material of the nanowire, nanobelt or nanosheet at the first position thereof. Thus, in certain embodiments, a light emitting device includes a second energy source configured to pump the semiconductor material of the nanowire, nanobelt or nanosheet at a second position of the nanowire, the second position being different than the first, the semiconductor material of the nanowire, nanobelt or nanosheet at the second position being different than the semiconductor material of the nanowire, nanobelt or nanosheet at the first position.

In the methods and devices as described herein, energy can be, for example, provided in the form of optical radiation having a wavelength corresponding to an absorption band of a semiconductor material of the semiconductor nanowire, nanobelt or nanosheet. Optical radiation can be provided, for example, by one or more light sources, each configured to provide optical radiation having a wavelength corresponding to an absorption band of a semiconductor material of the semiconductor nanowire, nanobelt or nanosheet. The optical source can be, for example, a diode laser. In certain embodiments, optical elements such as lenses and mirrors can be used to direct the light (e.g., with focusing) onto the semiconductor nanowire, nanobelt or nanosheet. The person of skill in the art will understand how to configure optical sources to illuminate the semiconductor nanowire, nanobelt or nanosheet.

In other embodiments, energy can be provided in the form of electrical energy, as is commonly done in semiconductor lasers. For example, the semiconductor nanowire, nanobelt or nanosheet can be configured as part of a diode structure for use in a laser, and pumped electrically. While various configurations for electrical pumping are described herein, the person of skill in the art will arrive at other configurations based on the particular materials used.

In certain embodiments of the methods and devices described herein, the bandgap emission wavelength of the first segment is longer than the bandgap emission wavelength of the second segment. In certain such embodiments, the second segment is looped. As will be described in further detail below, a looped segment design can help to reduce the loss of the short-wavelength segment, increasing the chance of lasing of short-wavelength radiation.

Figure 5:
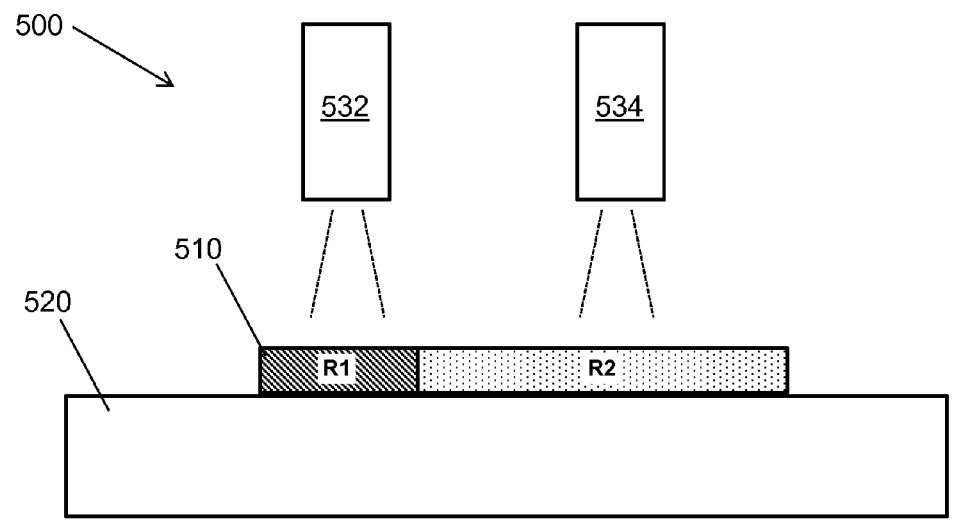
FIG. 5 is a partial schematic view of a light emitting device according to one embodiment of the invention.

One embodiment of a light emitting device according to the invention is shown in partial schematic view in FIG. 5. Optical device 500 includes a nanowire, nanobelt or nanosheet as described herein, indicated by reference numeral 510. The device further includes one or more energy sources configured to pump the semiconductor nanowire, nanobelt or nanosheet. In this example, the device includes a first energy source 532 (in this embodiment, a light source such as a laser) configured to pump the nanowire, nanobelt or nanosheet with energy corresponding to an absorption band of the semiconductor material of the nanowire, nanobelt or nanosheet at a first position of the nanowire, nanobelt or nanosheet (here, in the first segment R1). Device 500 also includes a second energy source 534 (in this embodiment, a light source such as a laser) configured to pump the nanowire, nanobelt or nanosheet with energy corresponding to an absorption band of the semiconductor material of the nanowire, nanobelt or nanosheet at a second position of the nanowire, nanobelt or nanosheet (here, in the second segment R2). Here, the second position is different than the first position.

While FIG. 5 shows the two light sources 532 and 534 as illuminating spatially separate positions on the nanosheet, the person of skill in the art will appreciate that other optical pumping schemes can be used. For example, multiple optical sources or a single tunable optical source can be configured to illuminate multiple segments of a segmented nanowire, nanobelt or nanosheet; since each segment will be pumped only by certain wavelengths, segments can be pumped individually or in combination by selecting the wavelength(s) of pump radiation individually or in combination.

Figure 6:
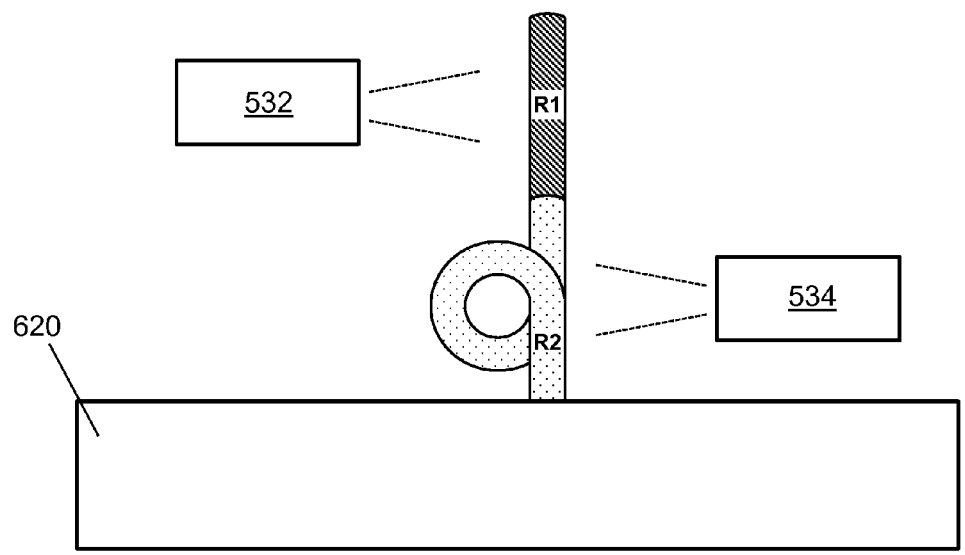
FIG. 6 is a partial schematic view of a light emitting device according to another embodiment of the invention.

In certain embodiments, the semiconductor nanowire, nanobelt or nanosheet is disposed on a substrate. The substrate can be of a size and composition suitable for the intended purpose. In certain examples, the substrate comprises Si, $SiO_2$ or other materials, including, but not limited to compound semiconductors. Such substrates can be n- or p-doped as is familiar to those skilled in the art, and can be selected in view of the overall architecture of the device, the pumping scheme used, and the particular semiconductor materials of the nanowire, nanobelt or nanosheet. In one embodiment, the substrate comprises $SiO_2$. Desirably, the substrate is of lower refractive index than the materials of the semiconductor nanowire, nanobelt or nanosheet. The nanowire, nanobelt or nanosheet can be disposed on the substrate in any convenient fashion. For example, in the embodiment shown in schematic view in FIG. 5, the nanosheet 510 is disposed horizontally on a substrate 520. In the embodiment shown in partial schematic view in FIG. 6, the looped nanowire 610 can be disposed horizontally on a substrate or vertically on a substrate 620 supported by other materials such as a polymer (e.g., polyimide), with laser sources 632 and 634 configured to pump segments R1 and R2 respectively.

Figure 7:
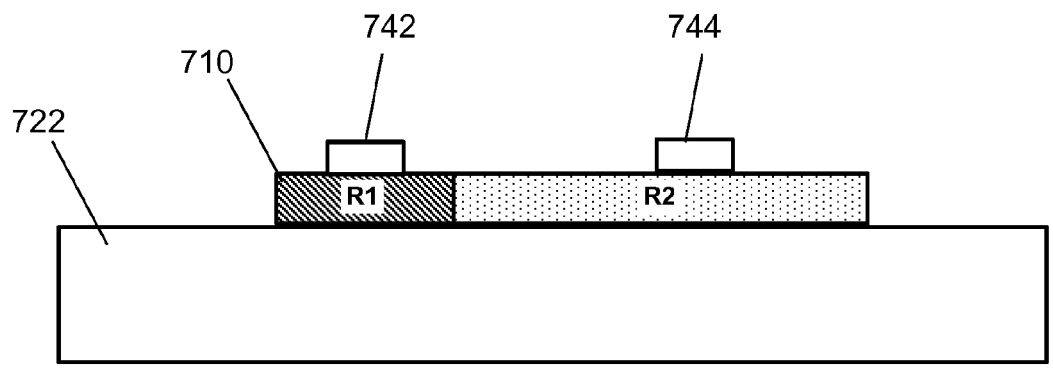
FIG. 7 is a partial schematic view of a light emitting device according to another embodiment of the invention.

Another embodiment of a light emitting device is shown in partial schematic view in FIG. 7. In this embodiment, the light emitting device is configured to be electrically pumped. Nanosheet 710 is disposed horizontally on a p-doped substrate 722, such that each segment (R1, R2) of the nanosheet is in contact with the substrate. Individual n-doped contacts 742, 744 are in electrical contact with the respective segments (R1, R2) of the nanosheet. Accordingly, each segment can be pumped independently of the other. The person of ordinary skill in the art will appreciate that other semiconductor diode designs can be used with the semiconductor nanowire, nanobelt or nanosheet as an active material.

Figure 8:
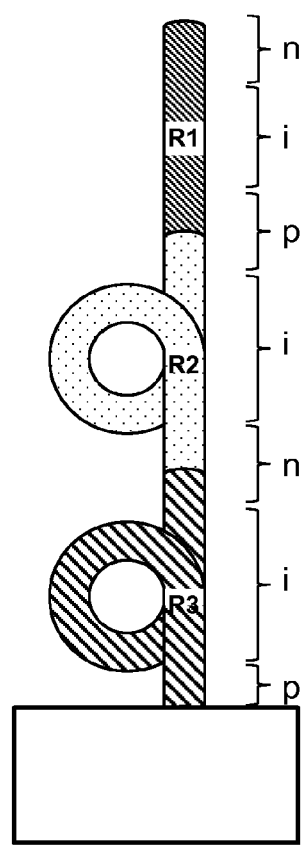
FIG. 8 is a partial schematic view of a light emitting device according to another embodiment of the invention.

Another embodiment of a light emitting device is shown in partial schematic view in FIG. 8. The device includes a nanowires, nanobelts or nanosheets, with each segment thereof including a p-i-n multilayered structure. The layers at the junctions between two adjacent segments have the same doping type (i.e., each is n-doped or each is p-doped). The term "p-doped" as used herein means atoms have been added to the material to increase the number of free positive charge carriers. The term "n-doped" as used herein means atoms have been added to the material to increase the number of free negative charge carriers. The "i-" portion of the p-i-n structure refers to an "intrinsic semiconductor" which, as used herein, means a semiconductor material in which the concentration of charge carriers is characteristic of the material itself rather than the content of impurities (or dopants). In the embodiment shown in FIG. 8, the nanowire is disposed vertically. In such embodiments, doping can be realized by adding different dopants at different stages of the material growth process, as would be understood by the person of ordinary skill in the art. Such light emitting devices can be pumped by electrical injection, using methods familiar to the person of ordinary skill in the art.

While the embodiments above have been described with respect to a single nanowire, nanosheet or nanobelt, the person of skill in the art will appreciate that a device or method as described herein can include a plurality of semiconductor nanowires, nanosheets or nanobelts, each configured as described herein. In certain embodiments, the plurality of semiconductor nanowires, nanosheets or nanobelts do not contact one another. Of course in other embodiments, the plurality of semiconductor nanowires, nanosheets or nanobelts can be in contact with one another. In certain embodiments, the device or method as described herein uses at least three, at least ten, or even at least 50 individual nanowires, nanosheets or nanobelts. (As an example, device with 100 semiconductor nanowires, nanosheets or nanobelts can be configured to deliver laser output of multiple mW, and even on the order of 10 mW.) Multi-element structures can be made using manual placement and looping procedures, as appropriate. In certain embodiments, template-assisted placement techniques can be used to produce multi-element structures.

As the nanowires, nanobelts and nanosheets described herein include a plurality of different segments, each having a different bandgap, the different segments can be individually pumped to give different combinations of emission wavelengths. Thus, dynamic control of the color(s) of light emitted by the devices and methods described herein can be obtained through selection of pumping energies and powers. For example, in optical pumping schemes, a light source can be selected to selectively excite (e.g., optically pump) one of the segments of the nanowires. Where more than two light sources are present, each light source can be selected to independently and selectively excite (e.g., optically pump) separate segments of the nanowires. In other embodiments, dynamic control of colors emitted by the light emitting devices can be obtained through individually-addressed electrical injection of each segment.

As described in more detail below, the orientation of the nanowire can also be used to control the output of the light emitting devices. In one embodiment, at least one segment of the nanowire is looped and at least one segment of the nanowire is not looped. In another embodiment, the semiconductor nanowire has two segments wherein each segment of the nanowire is not looped. In another embodiment, the semiconductor nanowire has three segments wherein each segment of the nanowire is not looped. In another embodiment, the semiconductor nanowire has two segments wherein one segment of the nanowire is looped and one segment of the nanowire is not looped. In another embodiment, the semiconductor nanowire has three segments wherein two segments of the nanowire are looped and one segment of the nanowire is not looped. In another embodiment, the semiconductor nanowire has three segments wherein two segments of the nanowire are looped and one segment of the nanowire is not looped, wherein the two looped segments are adjacent segments.

Accordingly, in one embodiment, a method as described herein includes directing energy at one or more segments of the nanowire, nanobelt or nanosheet to provide a first emission profile (i.e., the relative wavelength characteristics of the emitted radiation), then directing energy at one or more segments of the nanowire, nanobelt or nanosheet to provide a second emission profile different from the first. In another embodiment, a method as described herein includes selecting a desired emission profile, then directing energy at one or more segments of semiconductor nanowires, nanosheets or nanobelts to provide the selected emission profile. Thus, a single nanowire can provide for a tunable emission profile, which depends on the relative amounts of energy directed at different segments of the nanowire, nanobelt or nanosheet.

For example, multicolor light emission can be obtained from three-segment nanowires, nanobelts or nanosheets by selection of the bandgap of each segment. In certain examples, three-segment straight nanowire can be used in LED operation. The three segments can be, for example, formed from $Zn_xCd_{1-x}S_ySe_{1-y}$, with x and/or y being different for each segment. As the person of skill in the art will appreciate, the desired semiconductor compositions of the segments (e.g., values of x and y for the three segments described above) can be determined experimentally. The desired compositions (e.g., values of x and y) may also depend on other factors, such as the length of each of the three segments. In certain embodiments, nanowires, nanobelts or nanosheets can include three straight segments (e.g., each forming a laser cavity) in a single nanowire, nanosheet or nanobelt. In another embodiment, nanowires or nanobelts can include two segments each configured in a loop (e.g., each providing a laser cavity) and one straight segment (e.g., forming a laser cavity). Notably, the person of skill can adapt the three segment structures to provide white light, e.g., by selecting appropriate semiconductor materials and relative pumping powers among the three segments.

In another example, multicolor lasers can be obtained from two-segment nanowires, nanobelts or nanosheets. In one embodiment, a nanowire or nanobelt can include one segment in a loop (e.g., to form one laser cavity) and one straight segment (e.g., to form another laser cavity), interconnected through the nanowire, nanobelt or nanosheet. As described in more detail below, this configuration can have certain advantages with respect to dual-color lasing. In another embodiment, a nanowire, nanobelt or nanosheet can include two straight segment configured as coupled cavities within a single nanowire, nanobelt or nanosheet.

Figure 9:
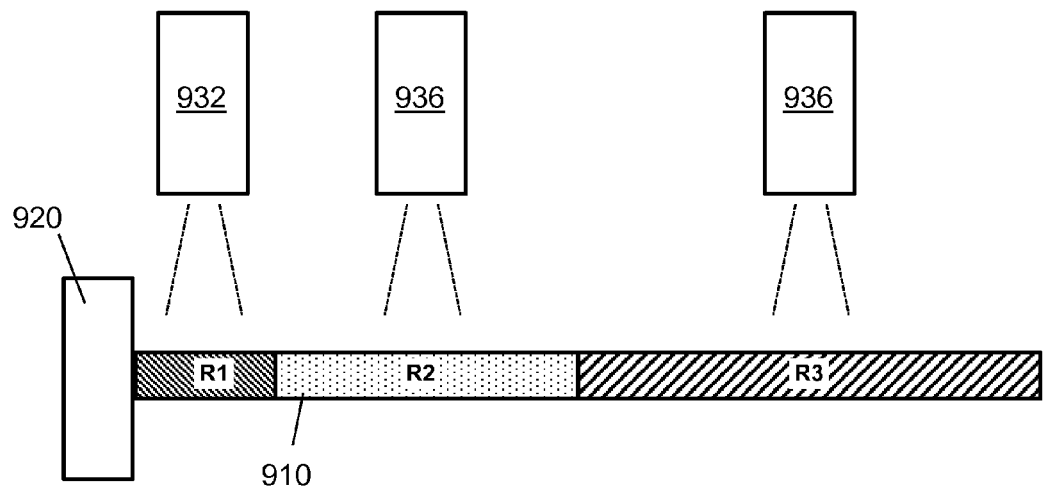
FIG. 9 is a partial schematic view of a light emitting device according to another embodiment of the invention.

One exemplary design for a light emitting device is shown in schematic view in FIG. 9. The nanowire, nanosheet or nanobelt 910 has three segments, R1, R2 and R3, each having a different composition (e.g., of the composition $Zn_xCd_{1-x}S_ySe_{1-y}$), each of the different compositions having a bandgap emission wavelength in a different visible color range (e.g., blue, green, yellow, red). For example, in one embodiment, segment R1 has a bandgap emission wavelength of 700 nm; segment R2 has a bandgap emission wavelength of 540 nm; and segment R3 has a bandgap emission wavelength of 470 nm. Light sources 932, 934, 936 are configured to pump the individual segments R1, R2, R3, as described above. In the embodiment of FIG. 9, the semiconductor structure extends vertically from the substrate 910, which has a lower refractive index than the semiconductor material and therefore can act as a reflector. In other embodiments, one or more reflectors (e.g., in multilayer thin film form) are disposed on the ends of the semiconductor nanowire, nanosheet or nanobelt to provide the reflectance desired to form a laser cavity. Of course, in certain embodiments, the index contrast between the semiconductor nanowire, nanobelt or nanosheet and the surrounding materials (e.g., substrate, environment) can provide sufficient reflectance.

In one particular aspect of the invention, a novel combination of gain materials and cavity design can be used to provide room temperature lasing of two visible colors (here, red and green) from a single {Cd}{SSe} nanowire. The wavelength separation of 107 nm between the two emitted colors is much larger than the gain spectra bandwidth limitation of typical semiconductor materials. Moreover, as described above, the overall color of the device output can be controlled dynamically between the two fundamental colors by changing the relative pumping strength of the two segments. This can allow the laser generation of any color between the two fundamental colors according to the color map of International Commission on Illumination (CIE). The composition along the nanowire varies, with the bandgaps of the terminal segments varying enough from one to generate the two distinct colors. Moreover, the gradual composition change in the transition region between the two terminal segments helps to assure acceptable quality of the crystal structure of the semiconductor materials.

By looping the larger bandgap end of the nanowire, two relatively isolated (or weakly coupled) cavities are created, reducing the absorption of the short wavelength light in the smaller bandgap section and allowing both segments (cavities) to lase simultaneously. This way, two of the fundamental challenges (i.e., material and cavity structure) encountered in multicolor lasing are addressed simultaneously.

Figure 10A:
FIG. 10A is a schematic view of a nanowire according to one embodiment of the invention.
Figure 10B:
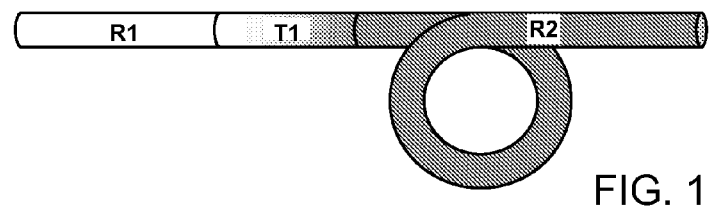
FIG. 10B is a schematic view of the nanowire of FIG. 10A, with one segment formed in a loop.
Figure 10C:
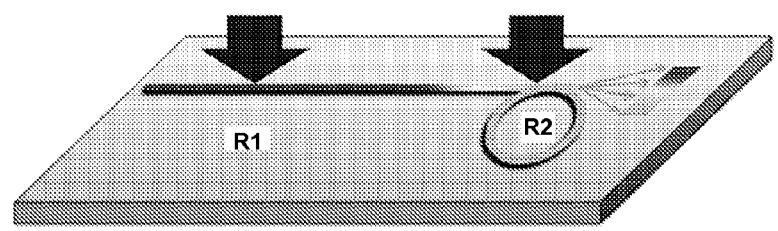
FIG. 10C is a partial schematic view of the nanowire as configured in FIG. 10B operating in a light emitting device.

One embodiment is shown schematically in FIGS. 10A-10C. FIG. 10A is a schematic view of a straight {Cd}{SSe} nanowire, with first segment R1 and second segment R2 separated by a transition zone T1. The nanowire can be made, for example, as described in Gu et al., J. Am. Chem. Soc., 133, 2037-39 (2011). The person of skill in the art will appreciate that there may not be a sharp transition between the composition of segment R1 and the transition zone T1 in the neighborhood of segment R1; and that there may not be a sharp transition between the composition of segment R2 and the transition zone T1 in the neighborhood of segment R2. The variation in shading along the nanowire represents the continuously changing composition. The sulfur composition, x, of a $CdS_xSe_{1-x}$ composition can be changed from 1 at one end to 0 at the other end, resulting in a color variation of bandgap emission from green to red along the nanowire, as shown in FIG. 10A. Accordingly, the bandgap of segment R1 corresponds to red light, and the bandgap of segment R2 corresponds to green light. In certain embodiments, such a nanowire may lase at different colors simultaneously since it contains different gain materials for different colors in one cavity. However, in certain configurations, the straight nanowire can only support red lasing due to the strong absorption of green light by the red segment. Because the wide-gap (CdS-rich) segment is transparent to the red light emitted by the CdSe-rich part, red light can easily reach the threshold and start lasing. However, the shorter wavelength emission from the CdS-rich section will experience a strong absorption in the narrower-gap (CdSe-rich) section, thus green lasing becomes nearly impossible without an extremely long segment.

In order to achieve simultaneous lasing at both long and short wavelengths, it can be advantageous to well-confine light emitted from the wide-gap semiconductor material within its own segment. One convenient and preferred way to create distinct cavities in a single nanowire or nanobelt structure is to loop the wide-gap section to form a relatively isolated cavity for the longer wavelength light. FIG. 10B is a schematic view of a looped nanowire. The junction coupling efficiency of such a ring cavity is very high, providing strong feedback for the longer wavelength emission and reducing the strong absorption in the narrower gap segment (here, R1). As a result, the longer wavelength mode can oscillate in the ring cavity with sufficiently high gain and sufficiently low loss to achieve lasing. At the same time, the red emission from the narrow-gap segment can still propagate in the entire nanowire with a cavity defined by the two end-facets of the nanowire.

The use of a looped-cavity design as described herein can enable the active tuning of the output color, as the shorter wavelength light is not completely absorbed by the narrow-gap segment of the nanowire. Thus, as described above, the looped segment can be pumped independently from the straight segment (e.g., by illuminating them with different optical power), allowing for the control of the emission profile by controlling relative intensities of emission between the two segments. Accordingly, the overall output can be continuously varied from the shorter wavelength emission (e.g., green in this example) to the longer wavelength emission (e.g., red in this example) corresponding to the relative pumping powers of the two segments, as shown schematically in FIG. 10C.

Figure 11A:
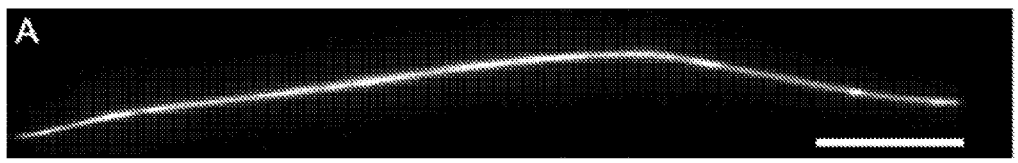
FIG. 11A is a dark-field image of a nanowire according to one embodiment of the invention.
Figure 11B:
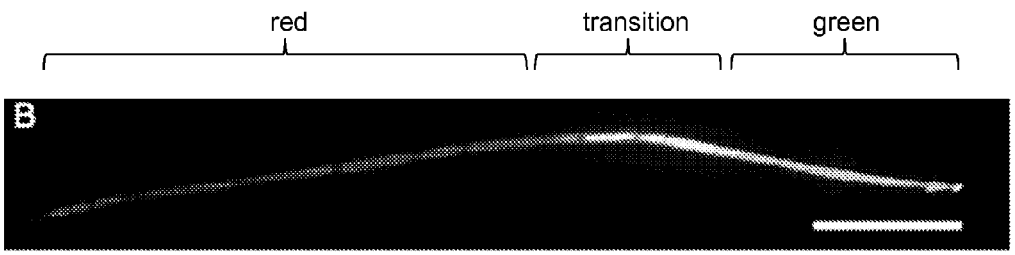
FIG. 11B is a real color photoluminescence image of the nanowire of FIG. 11A.
Figure 11C:
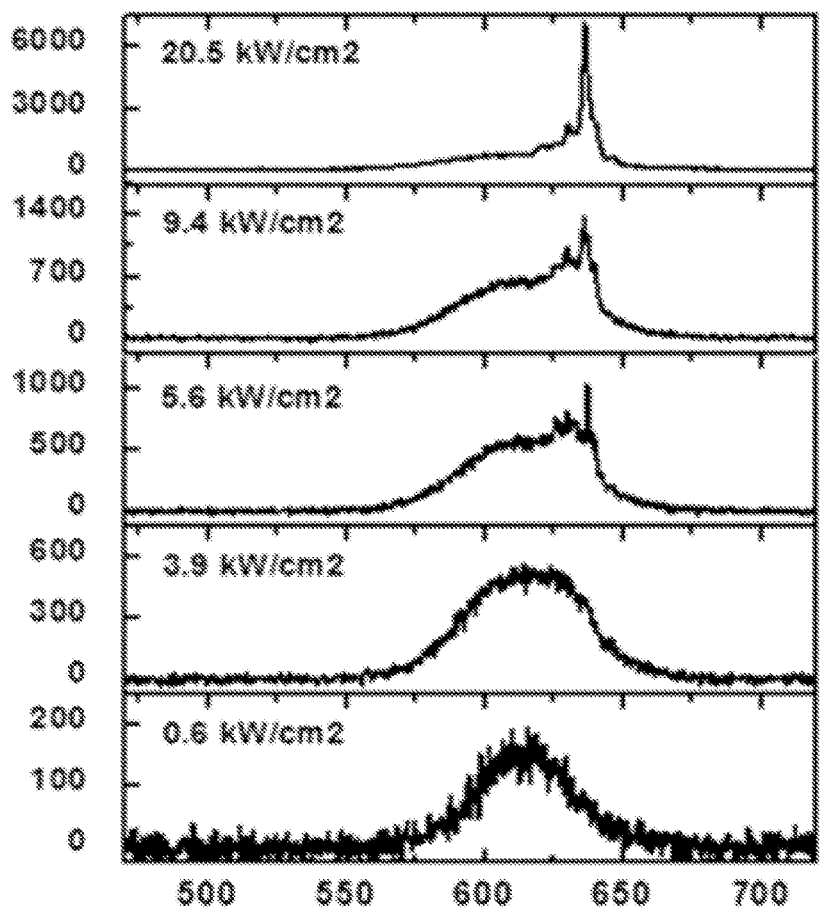
FIG. 11C is a set of emission spectra of the nanowire of FIGS. 11A and 11B.
Figure 11D:
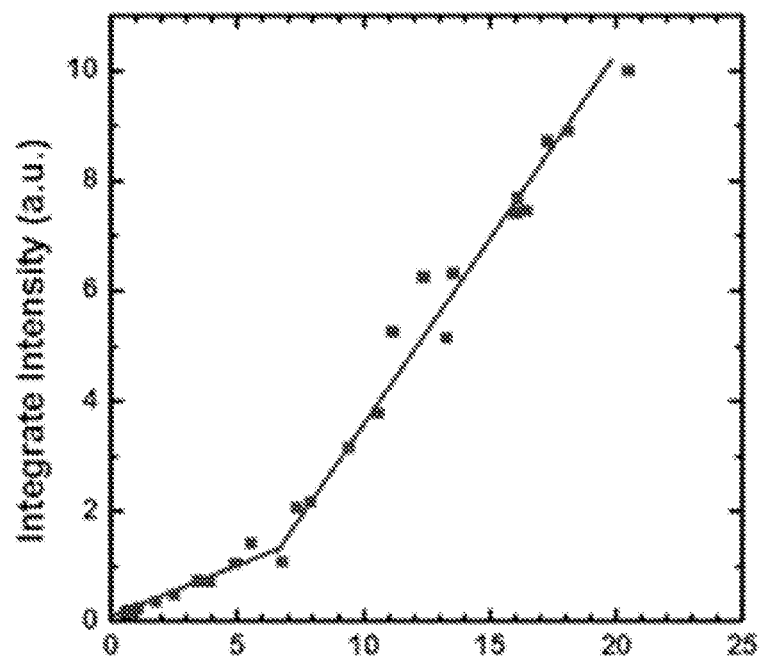
FIG. 11D is a plot of lasing peak intensity vs. excitation power for the nanowire of FIGS. 11A and 11B.

FIGS. 11A-11D provide the optical characterization of one exemplary {Cd}{SSe} nanowire before it is looped. A nanowire of 200 μm in length and 400 nm in diameter was placed on a glass substrate. FIG. 11A is a dark-field image of the nanowire. Due to the compositional grading along the length of the nanowire, the real color photoluminescence (PL) image shown in FIG. 11B under 405 nm laser excitation displays the corresponding color changes from green to red. The scale bars in FIGS. 11A and 11B are 30 μm in length. To demonstrate lasing, the nanowires were then pumped by a 355 nm pulsed laser with repetition rate of 10 Hz and pulse width of 9 ns (from the third harmonic of a 1064 nm YAG laser). The excitation laser is focused to a spot 250 μm in diameter to uniformly pump the entire nanowire. Various emission spectra under different pumping powers are shown in FIG. 11C. As described above, in this embodiment only the red lasing peak at 637 nm appears even up to high pumping levels. The integrated intensity of the lasing peak versus the excitation power is plotted in FIG. 11D, which shows a clear lasing threshold at 6.7 $kW/cm^2$.

Figure 12A:
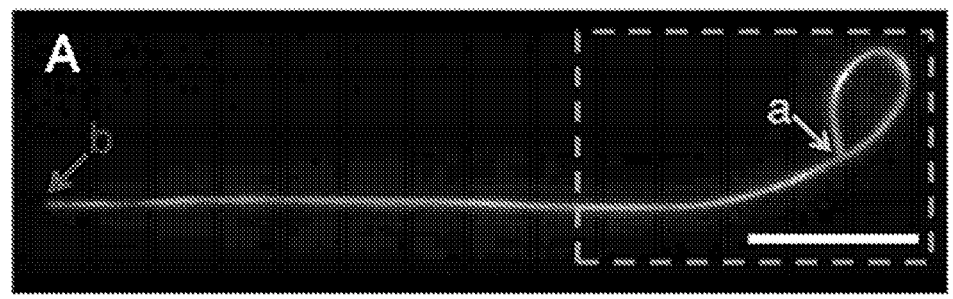
FIG. 12A is dark field image of a looped nanowire according to one embodiment of the invention.
Figure 12B:
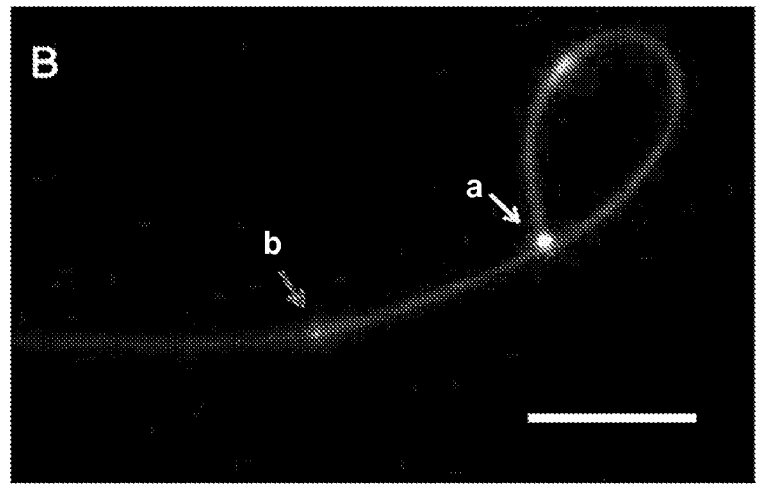
FIG. 12B is a real color photoluminescence image of the nanowire of FIG. 12A.
Figure 12C:
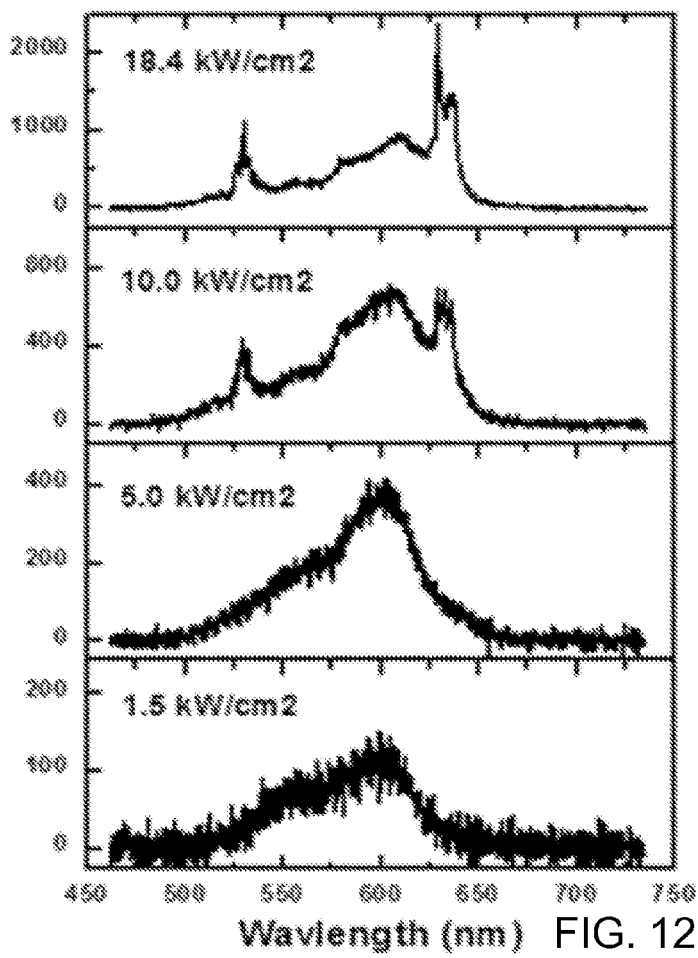
FIG. 12C is a set of emission spectra of the nanowire of FIGS. 12A and 12B.
Figure 12D:
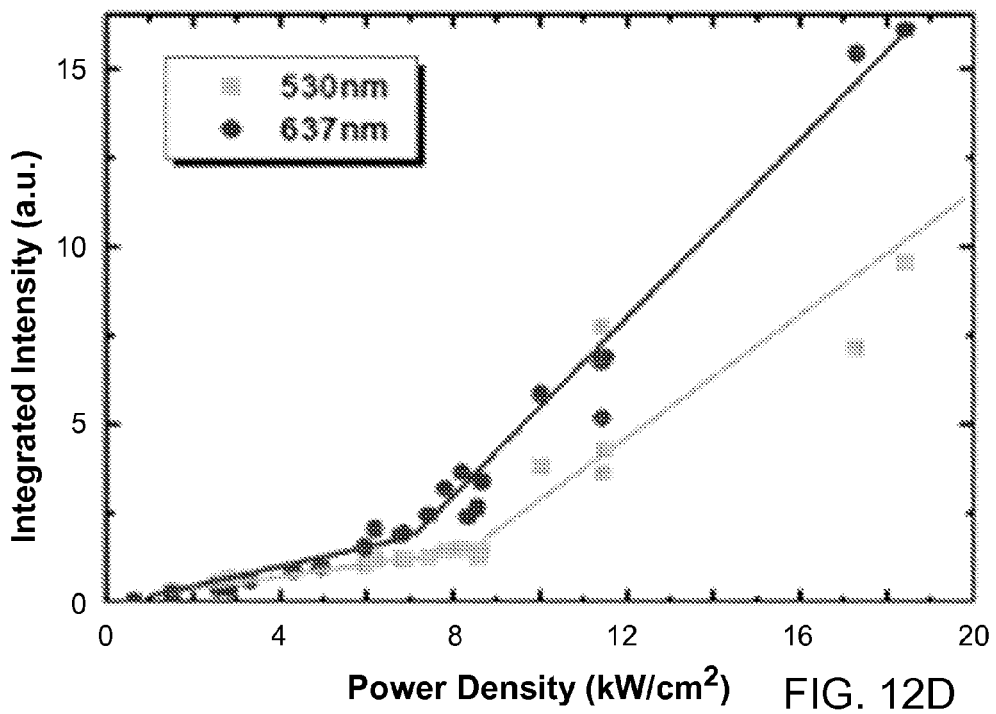
FIG. 12D is a plot of lasing peak intensity vs. excitation power for the nanowire of FIGS. 12A and 12B.

FIGS. 12A-12D illustrate the dual-color lasing achieved after looping the green end of the nanowire of FIG. 11A. A tapered glass fiber was used to manipulate and loop the green end of the wire into a 15 μm diameter circle, as shown in the dark-field image of the looped nanowire under white light illumination of FIG. 12A. Labels a and b indicate the junction of looping and the end point of the narrow-gap end, respectively. The scale bar is 30 μm. FIG. 12B shows the real color image of the dual-color lasing emission under uniform excitation of the entire structure. The image area corresponds to the dashed box of FIG. 12A. The scale bar is 15 μm. Arrow a indicates the junction of the loop, corresponding to the position a in FIG. 12A. Both red and green lasing can emit from this point, thus it appears in yellow color. Arrow b points to a scatter point on the wire body. The bright spot at the junction of the loop (labeled by arrow a) is a good demonstration of the waveguiding behavior. Because this junction is the output point of both green and red lasing, the color of this bright spot appears yellowish, as a result of color mixture of these two colors. As described in more detail below, the two-color lasing was from a single looped structure, and not from two separate structures each with different colors. In addition, a red spot (labeled by arrow a) is observed on the straight segment of this wire. Scanning electron microscopy was performed on this nanowire after lasing experiment and found that it is due to scattering from a small particle attached to the nanowire. Contrary to the case of straight nanowire in FIG. 11C, the lasing spectra of looped wire exhibits a significant green lasing peak at 530 nm under high excitation power as shown in FIG. 12C, while the center of red lasing peak remains at 637 nm, consistent with the lasing wavelength before looping. The output intensities of the two lasing peaks are plotted in FIG. 12D as a function of total pumping power density, showing clear threshold behavior for both colors, consistent with the spectral change in FIG. 12C. The threshold power density of red and green lasing are 6.9 $kW/cm^2$ and 8.7 $kW/cm^2$ respectively. The wavelength separation of green and red lasing modes is 107 nm, much larger than the gain bandwidth of the typical II-VI semiconductors of a single composition. Due to the largely separated optical cavities, the wavelength spacing of the two-color lasing is determined largely by the composition distribution along the nanowire. More details about the analysis of the average gain spectra for looped and straight cavities are provided below. For the geometry and composition gradient of the wire shown in FIG. 12A, the two wavelengths with maximum gain are separated by 123 nm, which is consistent with the experimental result of 107 nm. With further optimization of material growth, the wavelength separation can be extended to about 200 nm in such CdSSe alloy nanowires, as discussed further below.

Figure 12E:
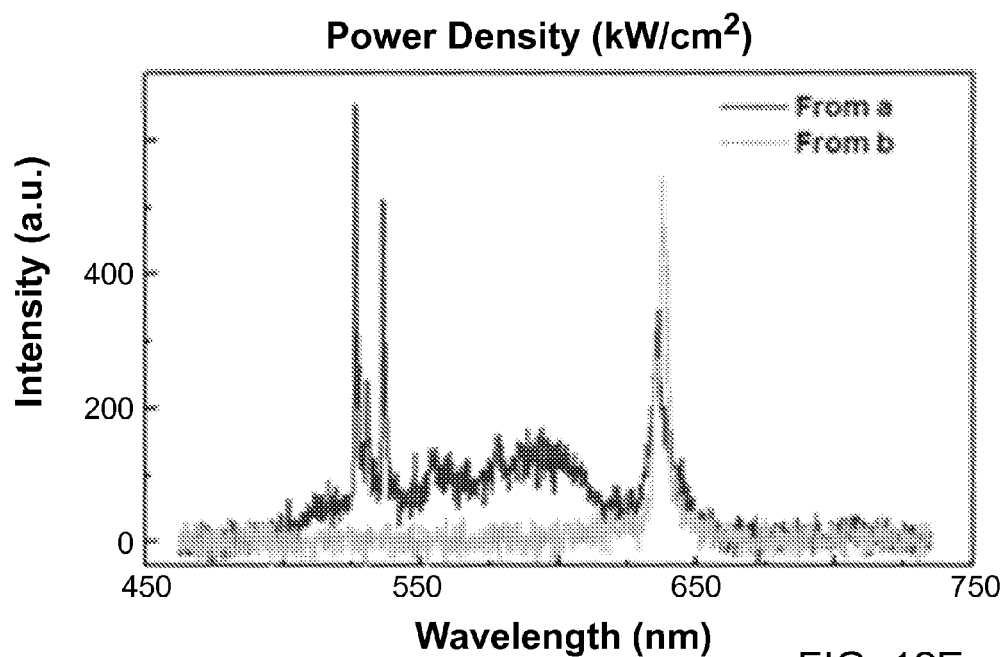
FIG. 12E is a confocal photoluminescence measurement of the nanowire of FIGS. 12A and 12B.

The confocal PL measurement in FIG. 12E demonstrates the output position of the two-color lasing. By inserting a pinhole into the image plane, emission spectra only from an area less than 5 μm were collected, at both the loop junction and the CdSe-rich end-facet (positions a and b in FIG. 12A, respectively). The spectrum at the junction shows both green and red lasing peaks while the spectrum at CdSe-rich end only exhibits longer wavelength lasing, consistent with the previous discussions. Because of the spatial filtering effect of the confocal system, the relative intensity of the green peaks is stronger than that obtained with a large collection area in FIG. 12C. The linewidth of a single lasing peak at 526 nm is 0.9 nm, limited by the resolution of the spectrometer. The longitudinal mode spacing is 1.1 nm. Using the approximate expression of the wavelength separation for a ring cavity: $\Delta\lambda = \lambda^2/Ln_g$, where L=47 μm is the length of the loop, a group index $n_g$ of 5.4 for the green mode was obtained.

Figure 12F:
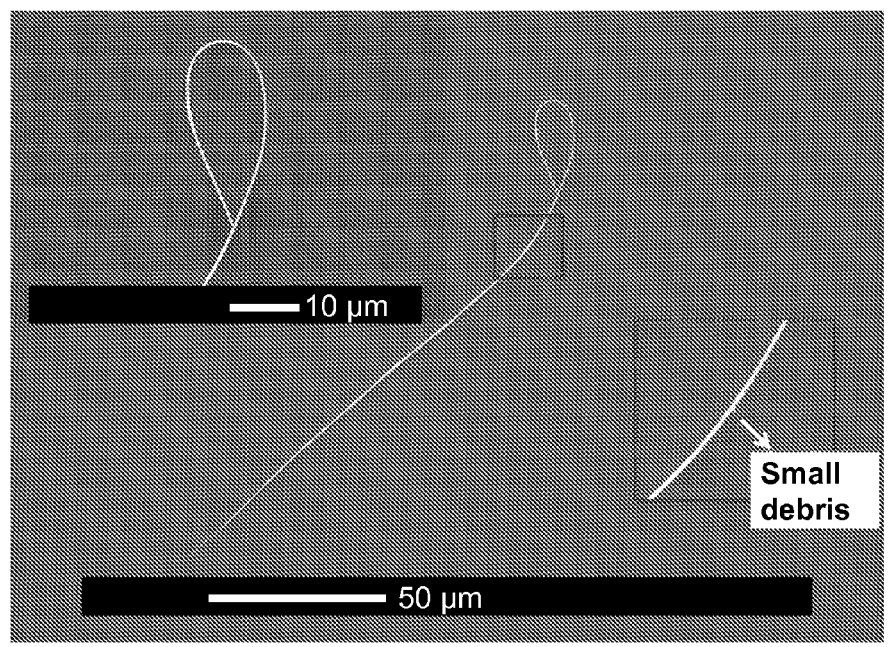
FIG. 12F is an SEM image of the looped wire of FIGS. 12A and 12B after lasing.

As noted above, for the two-color lasing experiment performed, individual nanowires were first picked up from the substrate on which they were grown and then transferred to a new clean glass substrate using a custom-pulled tapered fiber. In such an operation, it is possible that multiple nanowires are transferred, or debris is transferred along with the nanowire. Due to the relative large size of the excitation spot of the pumping laser, it is sometimes possible that multiple nanowires are excited or that debris is excited along with the nanowire. When the other nanowire(s) or debris has a different composition than the nanowire under test, multiple lasing peaks might be observed due to the different materials present. Moreover, even a single long nanowire could be broken into pieces of different compositions at high enough optical pumping. Different pieces could form laser cavities, thus lasing at different wavelengths. In the experiments described herein, the looped nanowire was examined by SEM imaging after the lasing experiment to ensure only one nanowire was within the laser spot, the wire has not been broken into segments, and the contact junction of the loop remained intact. FIG. 12F shows the SEM image of the looped wire after the lasing experiment that produced two-color lasing shown in FIG. 12D. The inset on the top left is a zoom-in of the loop part which forms the cavity for the green color lasing. The inset on the bottom right is a zoom-in showing a small particle attached to the nanowire causing scattering seen in FIG. 12B. As is evident, one end of the nanowire remained as a closed loop with 15 μm in diameter, similar to the initial looped structure before the lasing experiment. The contact angle of this loop is somewhat large but still provides enough feedback into the loop cavity. The total length of this nanowire is about 200 μm and its diameter is 450 nm. The entire nanowire remains intact after looping and lasing experiment and no breaking point was observed. Such SEM examination together with mode analysis allows to conclude that our dual-color lasing is from a single looped nanowire structure. Moreover, the red emission point in FIG. 12B is due to the scattering of the red lasing mode by a small defect on the straight part of the nanowire.

Regarding the gain spectra of the composition graded nanowire and nanowire loop: Typically, only single color lasing has been achieved in both single composition nanowire and heterostructure nanowires. As described above with respect to FIG. 11, the straight composition graded nanowire can only achieve single color lasing due to the absorption of the short wavelengths by the narrow gap segments. In order to understand this more quantitatively, the analysis of the optical gain spectra is necessary. The total optical gain of the composition graded NW can be given by the following equation:

$$G_{tot} = \frac{\int g(E_g)dl}{\int dl} = \frac{1}{L}\sum_{i=1}^{m} g(E_i)\Delta l_i,$$

where $g(E_g)$ is the gain spectrum of $CdS_xSe_{1-x}$ at a given composition x with bandgap $E_g$, L is the total length of nanowire. The above expression is meaningful as a linear optical gain only when the total length of the wire is smaller than the gain length (inverse of the absorption or gain coefficient). In this model, it is assumed that the composition changes linearly from the pure CdS to CdSe along the nanowire. For simplicity, bowing factor is neglected. Other parameters used in gain spectra calculation such as electron and heavy hole effective masses are also assumed to change linearly for $CdS_xSe_{1-x}$. The entire nanowire is 200 μm long and uniformly excited to a carrier density of $1.5 \times 10^{19}$ cm$^{-3}$ at 293 K. Parameters used in calculation are listed in Table 1.

TABLE 1

Parameters used in gain spectra calculation.

| | Effective electron mass | Effective heavy hole mass | Refractive index | Bandgap (eV) | Split-off energy |
|---|---|---|---|---|---|
| CdS | 0.21 | 0.7 | 2.60 | 2.44 | 0.079 (39) |
| CdSe | 0.13 | 0.45 | 2.56 | 1.74 | 0.42 |

Figure 12G:
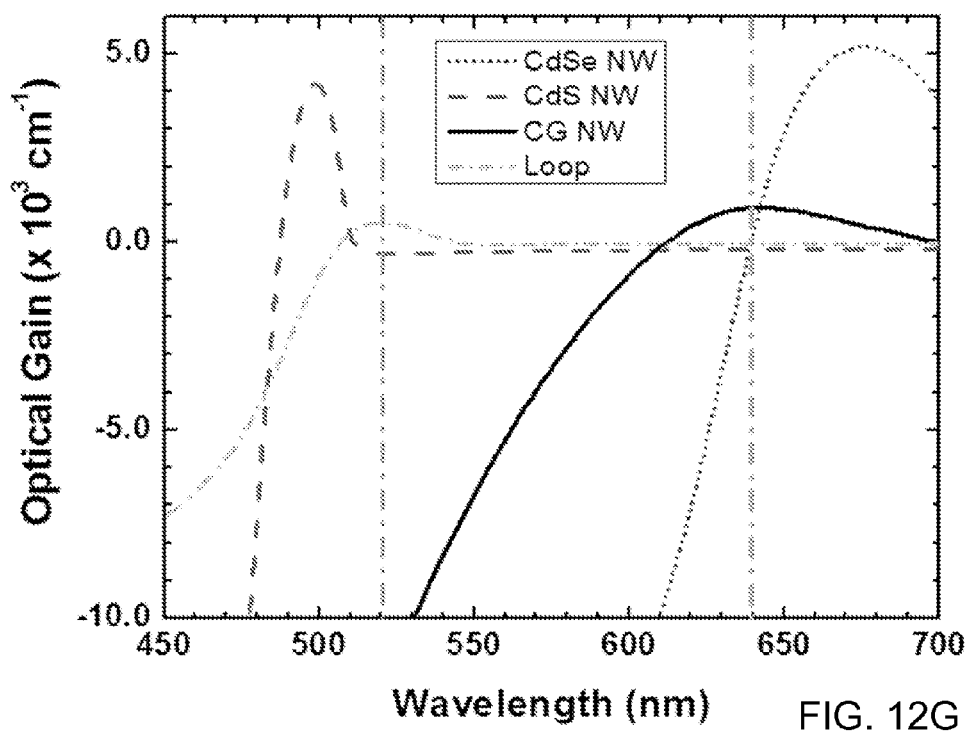
FIG. 12G is a set of calculated optical gain spectra for various theoretical nanowires.
Figure 12H:
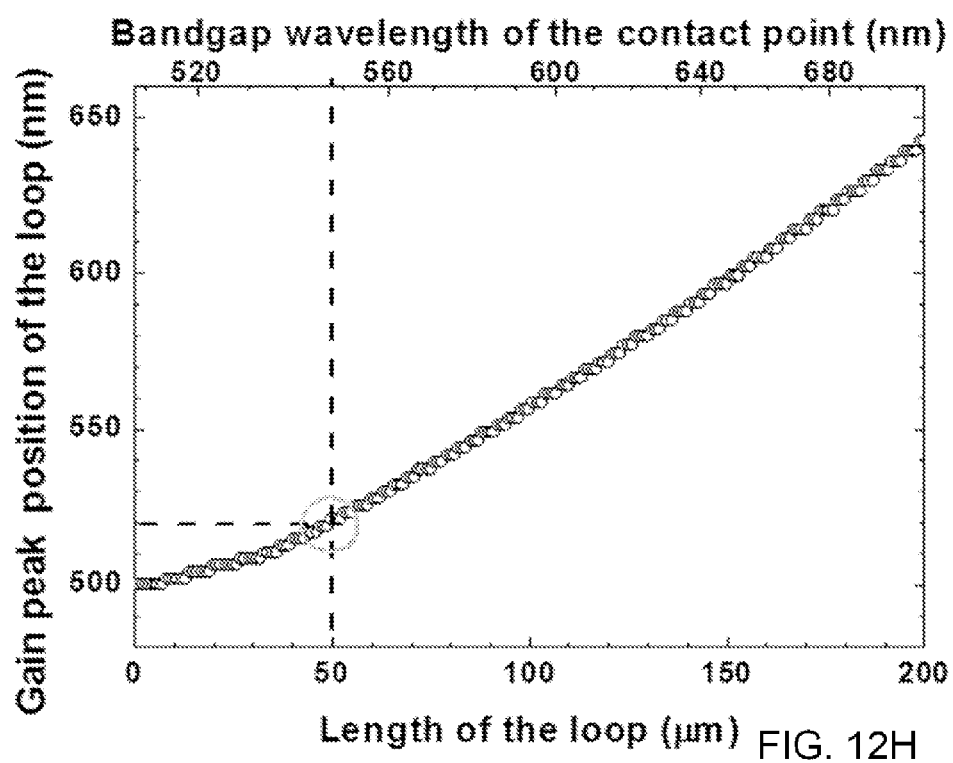
FIG. 12H is a plot of the peak wavelength of the optical gain spectra of FIG. 12G as a function of emission wavelength at the point where the wide-bandgap end touches the nanowire.

The calculated optical gain spectra are shown in FIG. 12G, in which the dashed line is for a pure CdS nanowire; the dotted line is for a pure CdSe nanowire; the solid line is for a composition graded CdSSe nanowire; and the dot-dashed line is for a CdS rich nanowire loop. The dash line and the dotted curves represent the gain spectra of a pure CdS and CdSe nanowire with the same length of 200 μm, respectively. The gain spectrum of the composition graded nanowire is shown in the solid curve. Such a gain curve can be understood as follows: First, although the peak gain of CdS at the green wavelength can be over 5000 cm$^{-1}$ when excitation is high enough, the optical loss of CdSe at the green wavelength is even larger (typically over 10000 cm$^{-1}$). Such a large absorption would deplete the gain completely in the green wavelength. On the other hand, due to the red shift of the gain curve as Se composition increases, the total gain curve is flattened so that the gain spectra of the composition graded nanowire is much broader (with a smaller peak value) than that of a nanowire with a single composition. When the CdS rich end of the composition graded nanowire is looped, the optical gain spectrum of the loop has contributions only from the segment that forms the loop, if the weak leakage from the loop junction into the straight part of the nanowire is ignored. Depending on the size of the loop, the peak position of the gain spectrum can vary. FIG. 12H shows the peak wavelength of the gain spectra as a function of the emission wavelength at the point where the wide-gap end touches the nanowire. For example, if the nanowire is looped to where the emission wavelength is 546 nm (corresponding to the length of 50 microns from the wide-gap end), the gain spectrum of the loop has a peak gain at 519 nm, as shown in the green curve in FIG. 12G. In this case, the looped cavity and the entire nanowire cavity reach maximum gain at 519 nm and 642 nm, respectively. The wavelength separation is 123 nm, close to the wavelength separation of 107 nm in our measurement of the two color nanowire laser, where the total length and the length of the loop are also around 200 μm and 50 μm, respectively (FIG. 12F).

Figure 12I:
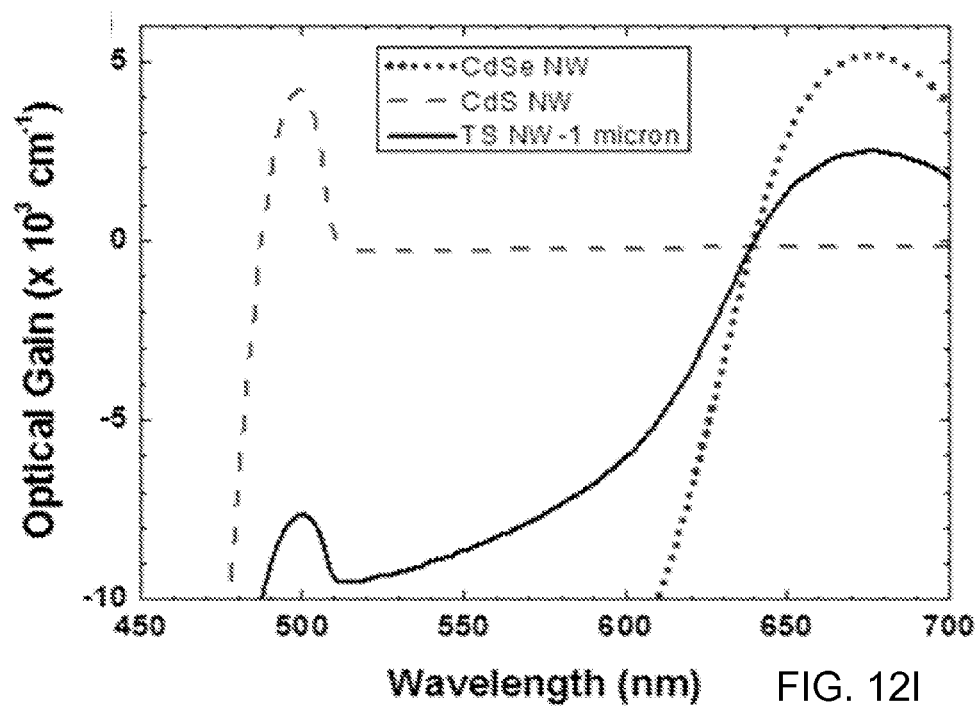
FIG. 12I is a plot of gain vs. wavelength for various segments of a theoretical looped nanowire.
Figure 12J:
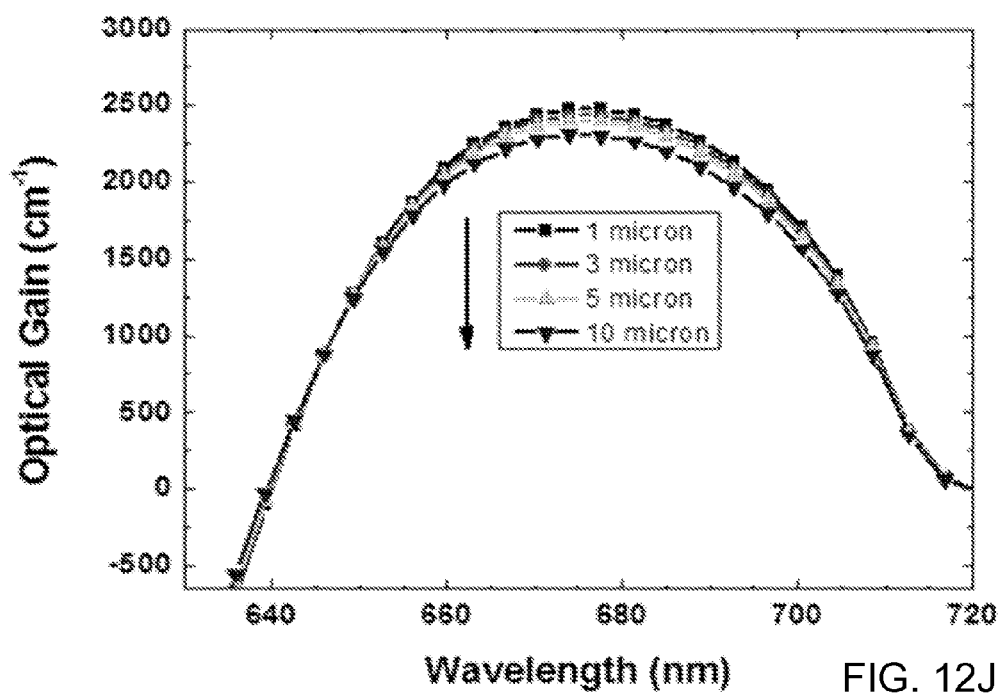
FIG. 12J is a plot of gain vs. wavelength for an entire theoretical nanowire for different transition lengths.

In fact, a nanowire consisting of two segments with different but constant composition in each is better for achieving dual-color lasing if the shorter wavelength end is looped. In theory, lasing wavelength separation of 200 nm is achievable if a pure CdS segment and a CdSe segment can be grown together to form a single nanowire. The nanowire of FIG. 10A can be configured with three segments: R1: pure CdSe, T1, continuously graded CdSeS from pure CdSe to pure CdS and R2: pure CdS. The short T1 segment allows a gradual lattice mismatch relief and can act as a buffer layer between the two single composition CdS and CdSe segment, allowing high quality growth of all materials. In the configuration of FIG. 10B, there are can be two weakly coupled cavities: the looped one with pure CdS as gain material and a straight cavity with mostly CdSe as gain material and a small segment of ternary alloy (as transparent material). The gain spectrum for this looped CdS cavity is shown by the dashed line in FIG. 12I. Here the length of both R1 and R2 are taken as 50 μm and T1 is 1 μm. The solid curve represents the average gain of the entire nanowire. The optical gain for the straight part of the CdSe is shown as the dotted line. In this case, a single nanowire looped structure can support a dual-wavelength lasing simultaneously at ~500 nm and ~700 nm, providing with about 200 nm wavelength separation. This would allow a dynamic color variation within a 200 nm range. Besides that, the average gain curve of the entire nanowire at the red color wavelength range does not change much with varying the length of T1. FIG. 12J shows average gain of the entire nanowire for different buffer segment length of 1, 3, 5 and 10 μm, demonstrating that the optical gain only decrease slightly when the length of T1 is increased from 1 μm to 10 μm. This is because that T1 is much shorter than the total length of the nanowire (~100 μm) and it does not contribute too much into the gain curve in the red color range. Thus the red color lasing wavelength would be independent on the length of the transition segment. Such flexibility in the transition segment length would further help us to realize two color lasing with large wavelength separation from the nanowire of FIG. 10B.

One advantageous property of the looped nanowire/nanobelt laser design described herein is the common output position for two-color lasing. Unlike RGB lasers and many other multicolor lasers, the dual-color light emitting devices described herein do not require external guiding to mix the multicolor lasing beams. More importantly, this feature allows color-tunable output via pumping the straight and looped segments separately, as described above and as indicated in FIG. 10C. For example, a beam splitter can be used to split the excitation laser into two beams for pumping the CdSe-rich straight part and CdS-rich loop separately. Neutral density filters can be applied after the beam splitter to precisely control the incident power of two excitation beams. Of course, the person of skill in the art will appreciate that there are other ways to provide different intensities of pump radiation to the different segments.

In another embodiment green/red dual-color lasing with maximum wavelength separation of 110 nm (0.42 eV) can be achieved in a single spatial bandgap-engineered $CdS_xSe_{1-x}$ alloy nanowire. The alloy composition changes spatially along the growth direction of the single nanowire, resulting in a bandgap changing from 2.44 eV to 1.72 eV within one single nanowire. Such a nanowire can supply optical gain for both green and red lasing. By looping the segment with the large bandgap (CdS dominated) which emits green color light) of the nanowire, two individual cavities are formed within one nanowire: a looped circle cavity for confining the green (CdS dominated) the original wire cavity for confining the red (CdSe dominated) emission. Dual-color lasing was observed at the end face of the wire loop when the entire nanowire was optically pumped by a laser beam. Dynamic color control of the output lasing can be achieved by adjusting the relative intensity of two lasing modes through two pumping laser beams which independently pump each individual cavity. The continuous tunability of lasing color from green to yellow to red in a single nanowire device was observed. The approach has great potential in lasing display and white lasing lighting.

Figure 13A:
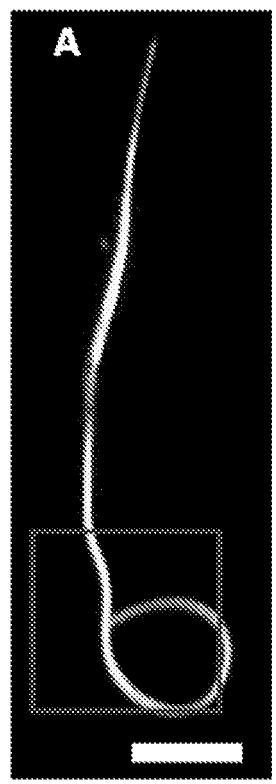
FIG. 13A is a dark field image of a looped nanowire according to another embodiment of the invention.
Figure 13B:
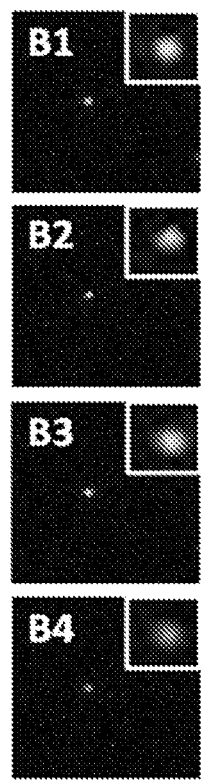
FIG. 13B provides a real color images of lasing of the nanowire of FIG. 13A under different pump conditions.
Figure 13C:
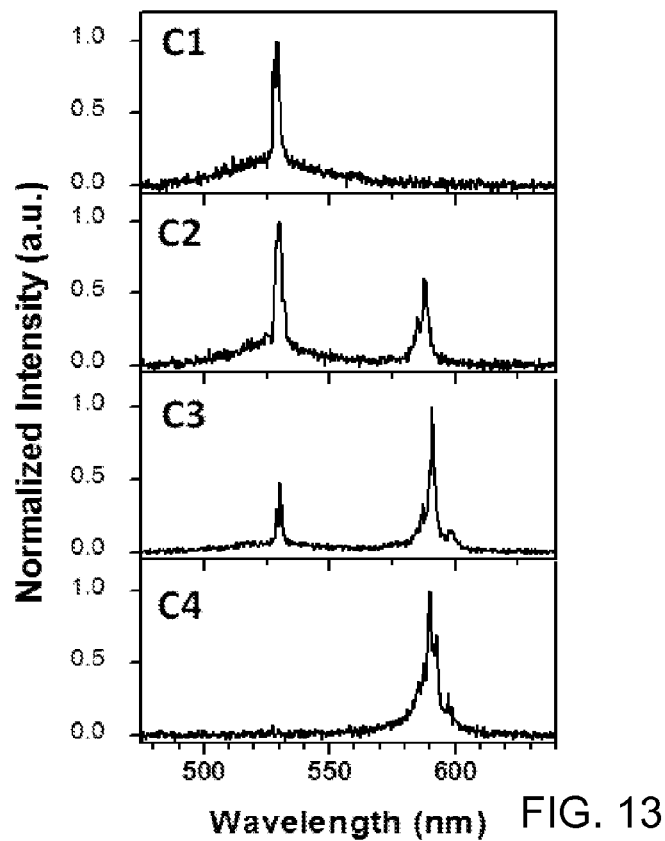
FIG. 13C is a set of normalized lasing spectra under different controlled pumping intensities, collected simultaneously with the images of FIG. 13B.

FIG. 13A shows the dark-field image of such a looped nanowire, in which the scale bar is 10 μm. FIG. 13B provides real color images of the lasing under different pumping for the two cavities. The images are taken from the box in FIG. 13A. The bright spots correspond to the junction of the loop. The various insets B1-B4 show the zoom-in images of the junction lasing spots. By adjusting the intensities of two pump beams, the output color at the junction was tuned from green (FIG. 13B, B1) to yellow-green (FIG. 13B, B2) to yellow (FIG. 13B, B3) to orange (FIG. 13B, B4). FIG. 13C provides normalized lasing spectra under different controlled pumping intensities, collected simultaneously with the images of FIG. 13B. In C1 and C4, only one of the two excitation beams was used for excitation while the other one is blocked. Therefore only one lasing color is observed at either 530 nm (green) or 588 nm (orange). In C2 and C3, the relative intensity of the green and orange lasing is controlled at 6:4 and 3:7, respectively. The mixed colors are represented as the intermediate colors between green and orange, which are close to yellowish green (B2) and yellow (B3). In 13D, the chromaticity of the C1-C4 spectra are marked on CIE 1931 color space by ★, ▲, ● and ■ respectively. The mono-wavelength lasing of C1 and C4 are located at the curved edge of the color space. C2 and C3 can be considered as the linear combination of two equivalent wavelengths, and the corresponding chromaticity are marked on the dashed line in FIG. 13D. The calculated colors in FIG. 13D match perfectly with the colors in real color images shown in FIG. 13B, further validating the monochromic property and color tunability of this looped nanowire laser. Additionally, any color on the dashed line can be obtained from this nanowire by precise control of the relative power of the pumping beams. Such continuously controllable colors can be very useful in many applications such as color-by-design for lighting, color display, or other technological interfaces.

In another embodiment, a {Cd}{SSe} nanosheet is used as the gain medium. An example of such a nanosheet is shown in side cross-sectional view in FIG. 5, as described above. In one example, the CdSSe laterally segmented nanosheets (i.e., heterostructure nanosheets) were grown through a chemical vapor deposition (CVD) approach using CdS and CdSe powders (Alfa Aesar, 99.99% purity) as source materials. A Si substrate with 10 nm Au film as catalyst was used for the growth. The reactor was first evacuated to a pressure below 0.2 Torr by a mechanical pump. 150 sccm $N_2$ was then introduced into the system, and flow was maintained for 30 min prior to growth. In the first step of the growth, only CdS powder was thermally evaporated at 880° C. for 1 hour. Subsequently, CdSe source was introduced into the furnace, while the temperature was gradually lowered to 840° C. and held for 40 min to grow the CdSe-rich sections. The growth processes are similar to that Kim, Y. L. et al., "CdS/CdSe lateral heterostructure nanobelts by a two-step physical vapor transport method," Nanotechnology 2010, 21, 145602, which is hereby incorporated herein by reference in its entirety; the presently described process reverses the growth sequence from CdSe/CdS to CdS/CdSe. Such sequential growth ensures a wide CdS-rich center section surrounded by CdSe-rich edges (see FIG. 14B). The large width of CdS-rich sections is especially significant as it needs to be wide enough to achieve sufficient optical confinement for the shorter wavelength lasing modes. FIG. 14A shows the transmission electron microscopy (TEM) image of a CdSSe laterally segmented nanosheet. The image was collected with a JEOL JEM-2010 High-Resolution Transmission Electron Microscope at 200 kV, equipped with a Link energy dispersive X-ray spectroscopy (EDS) detector. The nanosheet of FIG. 14A has width of 11.2 µm and length of 41.4 µm. FIG. 14B shows the real color photoluminescence (PL) image of the heterostructure nanosheet under 405 nm continuous-wave (CW) laser excitation. The scale bars in FIGS. 14A and 14B are 10 µm. As seen in the image, the nanosheet consists of three stripes with (green in color) emission in the center (grown initially with CdS-rich composition) and (red/orange in color) emission on both edges (grown subsequently with CdSe-rich composition). The green stripe and the wider red/orange stripe (on the right side of FIG. 14B) form two rectangular, coupled cavities in a side-by-side arrangement. With proper end facets, the three stripes can form three coupled cavities capable of supporting various propagating modes along the length direction. Of particular interest are the two wider stripes (the green one in the center and the red/orange one on the right side) which form two rectangular, coupled cavities in a side-by-side arrangement (as also schematically shown in FIG. 15C). Detailed characterization of the composition and interface of the nanosheet was achieved by an EDS line scan across the nanosheet as indicated by the white dashed line in FIGS. 14A and 14B.

FIG. 14C is a comparison of sulfur molar fraction between EDS scan (hollow triangles) and micro-PL scan (solid squares) along the white dashed line in FIGS. 14A and 14B. Shown as hollow triangles in FIG. 14C, the sulfur molar fraction was plotted as a function of the spatial position across the width of nanosheet. The clear reduction of the sulfur molar fraction from ~70% to ~42% provides direct evidence of the existence of the heterojunction between the CdS-rich and CdSe-rich stripes. The data of FIG. 14C demonstrates that the transition zone between the CdS-rich and CdSe-rich stripes is on the order of 200 nm in length.

Micro-PL scan measurements were performed on the same nanosheet. The 405 nm excitation laser beam was focused down to a spot size less than 2 µm and was scanned across the width of the nanosheet to excite light emission from different points along the sample. The photoluminescence peak positions vary abruptly from green emission at 559 nm to orange emission at 602 nm at the location corresponding to the interface between stripes as identified by EDS (i.e., at a position of about 9.2 µm in FIG. 14C). Moreover, the sulfur molar fraction of the $CdS_xSe_{1-x}$ composition can also be extracted from the wavelength of the PL peaks by band gap interpolation between the two binary endpoints, CdS and CdSe:

$$E_g(CdS_xSe_{1-x}) = xE_g(CdS) + (1-x)E_g(CdSe)$$

Because of the relaxations of the effective strain resulting from the single crystallinity of the nanosheet, the calculation neglects any the bowing effects. The filled squares plotted in FIG. 15C show the sulfur molar fraction calculated from the micro-PL scan measurement as described. The composition values are consistent between EDS and micro-PL scans.

Figure 15A:
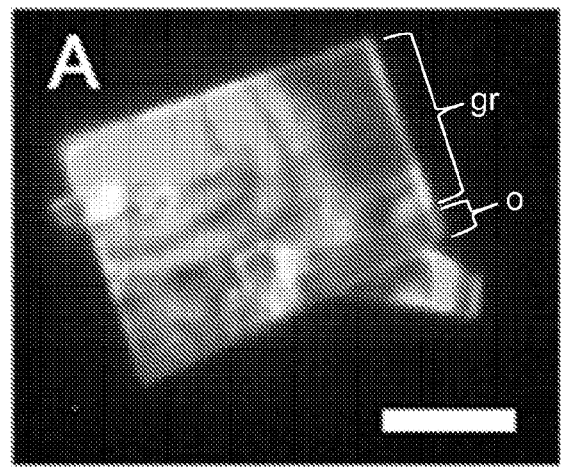
FIG. 15A is a real color photoluminescence image of a nanosheet according to another embodiment of the invention.
Figure 15B:
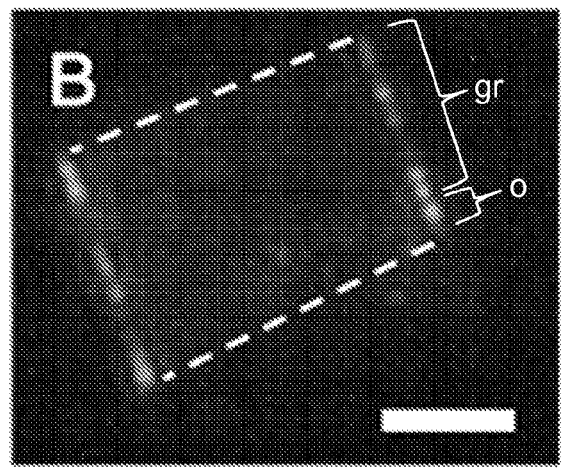
FIG. 15B is a real color photoluminescence image of the nanosheet of FIG. 15A under lasing conditions.
Figure 15C:
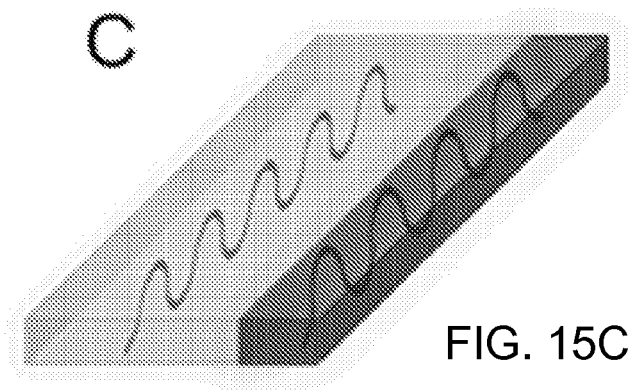
FIG. 15C is a schematic perspective view of a segmented nanosheet according to one embodiment of the invention, showing the side-by-side arrangement of two separate laser cavities.

FIG. 15A shows a PL image of another lateral heterostructure nanosheet. The dimensions of this nanosheet are 25.0 µm (length) by 17.4 µm (width) by 200 nm (thickness). The nanosheet was cleaved from a longer piece by the bend-to-fracture method. With this procedure, high-quality end facets were created which play the role of facet reflectors and define the laser cavities. The widths of the CdS-rich (green) and CdSe-rich (orange) sections are 14.8 µm and 2.6 µm, respectively. The PL emission peaks from the CdS-rich and CdSe-rich sections are at 546 nm (green) and 591 nm (orange), respectively. As shown in the PL image, there is broken nanosheet debris surrounding the nanosheet of interest, observable by the lighter orange areas within the belt and the excess green areas outside of the nanosheet perimeter. To demonstrate the capability of dual-color lasing, the nanosheet was optically pumped by the third harmonic of a Q-switched Nd:YAG laser (355 nm, 10 Hz, 9 ns). The sample was transferred onto a sapphire substrate and loaded into a cryostat for low temperature measurement. The laser was focused into a 120 µm by 60 µm ellipse at an angle of 60° from the sample normal direction. The real-color image of single pulse induced dual-color lasing at higher pumping level (409 kW/cm$^2$) at 77 K is shown in FIG. 15B. The dashed lines in FIG. 15B denote the side edges of the nanosheet. The scale bars in FIGS. 15A and 15B are 10 µm. The largely uniform emission of FIG. 15A is now replaced by the green and orange bright spots along the end facets, signifying the occurrence of lasing. Due to the gain-guiding effect and the refractive index contrast, green and orange emission can be well-separated and confined in their own cavities, which is schematically shown in FIG. 15C. This is reflected in FIG. 15B, where green and orange emissions from the end facets are from the respective segments of CdS-rich or CdSe-rich materials. The interaction between the green and orange modes is minimized in this structure. The side-by-side arrangement is an important geometry for reaching the respective lasing thresholds of both colors. Short-wavelength emission from the wide bandgap region (CdS-rich) can be significantly absorbed by the narrow bandgap region (CdSe-rich), which is a severe challenge for multi-wavelength lasing. Such absorption will increase the threshold for the short wavelength lasing, very often to a degree that is too high to achieve lasing. The side-by-side arrangement described herein can reduce such undesired absorption and allowed the respective lasing thresholds of both wavelengths to be reached.

Figure 15D:
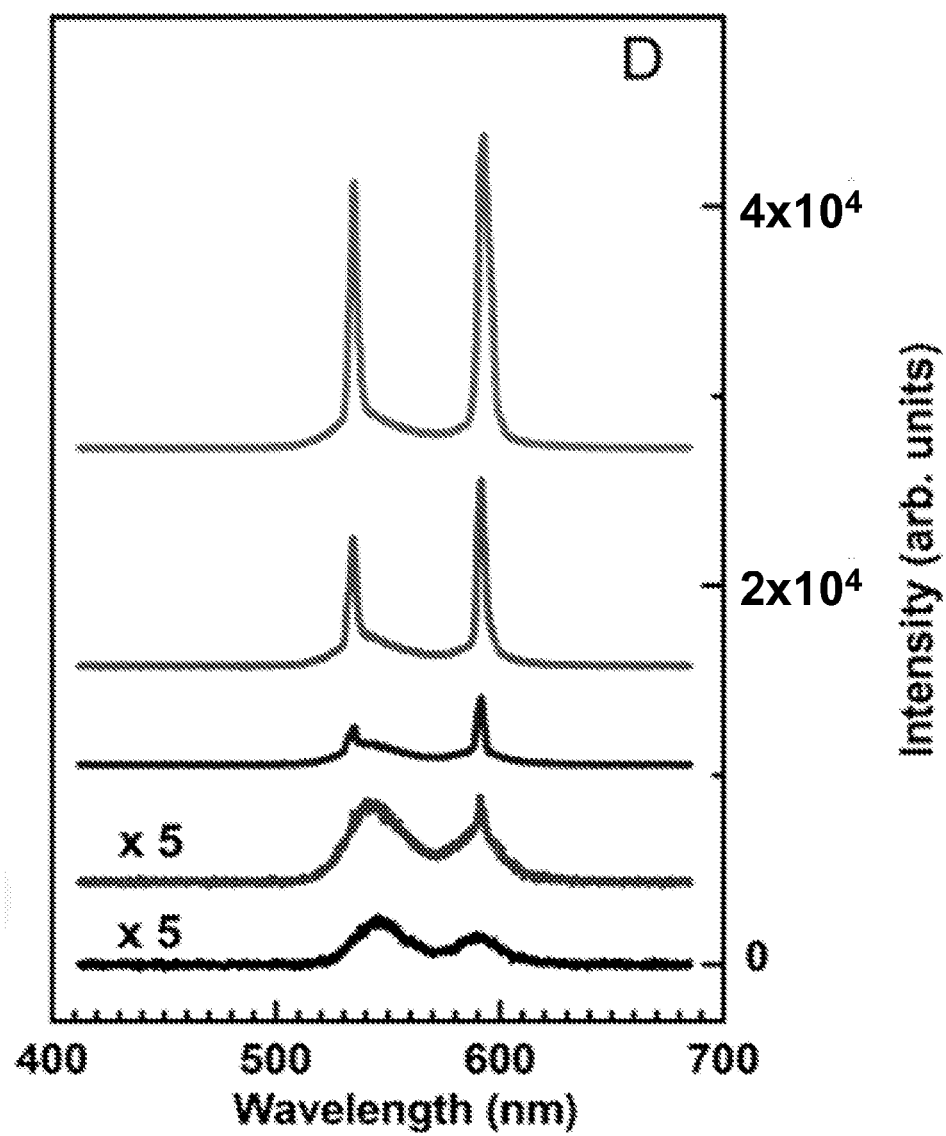
FIG. 15D is a set of photoluminescence spectra of the nanosheet of FIGS. 15A and 15B at 77K under increasing levels of pumping power density.

FIG. 15D is a set of PL spectra at 77K under increasing levels of pumping power density of 77, 173, 241, 338 and 668 kW/cm$^2$ from bottom to top. In order to demonstrate the spatial separation of the green and orange lasing modes and to understand the lasing mechanism, a 2-dimensional simulation was performed for the optical modes in the CdSSe nanosheet with the lasing wavelengths around 534 nm and 592 nm, as observed experimentally (see FIG. 15D). In this 2D model, the length of the nanosheet is assumed to be infinite long with cross-section as shown in FIG. 15C. The sulfur compositions (x) of the CdS-rich and CdSe-rich sections as determined from their PL emission peaks are x=0.82 and x=0.49, respectively. The complex refractive indices of these CdSSe alloys are listed in Table 2. The real parts of the refractive indices for $CdS_{0.82}Se_{0.18}$ and $CdS_{0.49}Se_{0.51}$ are obtained from Jensen, B. et al., "Refractive index of hexagonal II-VI compounds CdSe, CdS, and $CdSe_xS_{1-x}$," J. Opt. Soc. Am. B 1986, 3, 857-63, and refractive index database SOPRA (http://www.sspectra.com/sopra.html), respectively. The gain and absorption are taken into account by the imaginary part of the complex refractive index, sometimes called the extinction coefficient. The gain (g) or absorption and the extinction coefficients obey the following relationship:

$$g = \frac{4\pi}{\lambda}k$$

where k is the imaginary part of the complex index of refraction, λ is the wavelength, and g is the gain or absorption coefficient (with a negative sign). A positive extinction coefficient represents gain, and negative represents absorption. Here it is assumed that the absorption of $CdS_{0.49}Se_{0.51}$ at 534 nm is 50,000 $cm^{-1}$. Under optical pumping, the gain coefficients in active regions are assumed to be 3,000 $cm^{-1}$ which is reasonable assumption to overcome the mirror loss.

TABLE 2

Summary of Refractive Index used in Simulation

| Wavelength | Refractive Index | |
| --- | --- | --- |
| | $CdS_{0.82}Se_{0.18}$ | $CdS_{0.49}Se_{0.51}$ |
| 534 nm | 2.625 + 0.0127i | 2.738 − 0.213i |
| 592 nm | 2.538 | 2.837 + 0.0141i |

Figure 16:
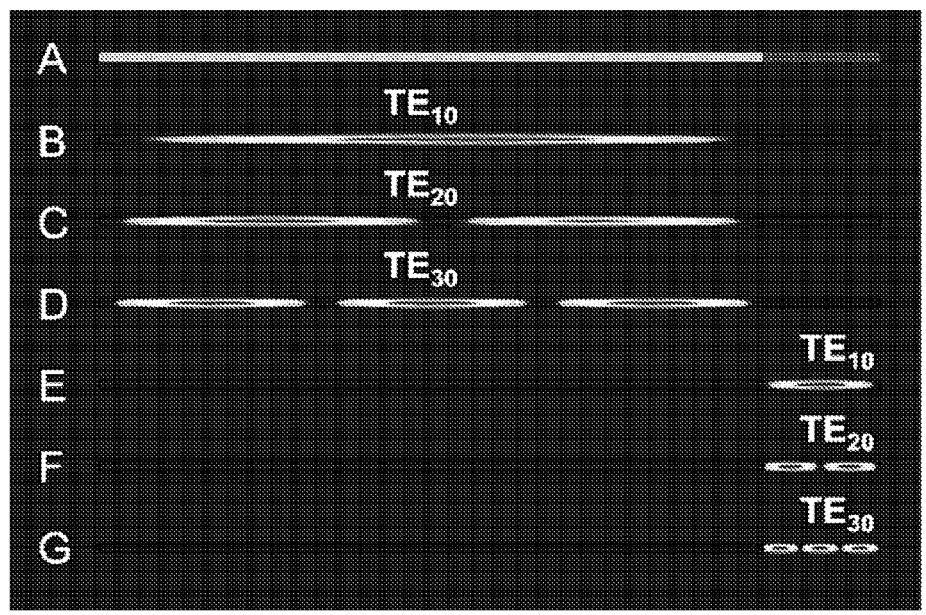
FIG. 16 is a diagram of the calculated modes of a theoretical segmented nanosheet.

From the simulation, the first three modes with high gain are selected for each wavelength and are displayed in FIG. 16. FIG. 16 shows the cross section of a nanosheet in the thickness-width plane. The propagation direction is perpendicular to the paper plane. (A) is the schematic plot of the nanosheet cross-section. The green (left) and red (right) rectangles represent the CdS-rich (14.8 μm width) and CdSe rich segments (2.6 μm width), respectively. The thickness is 200 nm. (B-D) are the first three modes at 534 nm. (E-G) are the first three modes at 592 nm. The amplitude of the electric fields of high-gain modes at 534 nm and 592 nm are shown in FIG. 16(B-D) and FIG. 16(E-G), respectively. For both wavelengths, the high-gain modes are well-confined in their respective active regions (CdS-rich segment for 534 nm, left in FIG. 16(A), and CdSe-rich segment for 592 nm, right in FIG. 16(A)). It can be useful to determine the confinement factor, defined as the ration of the modal gain to the material gain, it can be significantly large in nanowires and nanobelts. The confinement factors for all of these modes are slightly larger than unity at 1.03. In general, modes of both wavelengths can be confined in either the CdS-rich or CdSe-rich segment due to the contrast between the refractive indices. However, only the modes in appropriate gain medium with wavelength inside the gain bandwidth have the possibility to lase. As a result, high gain modes at 534 nm (or 592 nm) can only lase in the CdS-rich (or CdSe-rich) active regions. The refractive index contrast and the gain selection ensure that the modes of both wavelengths are confined within their respective gain media without much leakage to the lossy regions. This is especially important for the green modes, so that they will not be subject to strong absorption by the narrow gap material of the CdSe-rich side. The simulation provides further evidence that the CdSSe heterostructure nanosheet provides an appropriate structure to support dual-wavelength lasing in a single structure.

Figure 17:
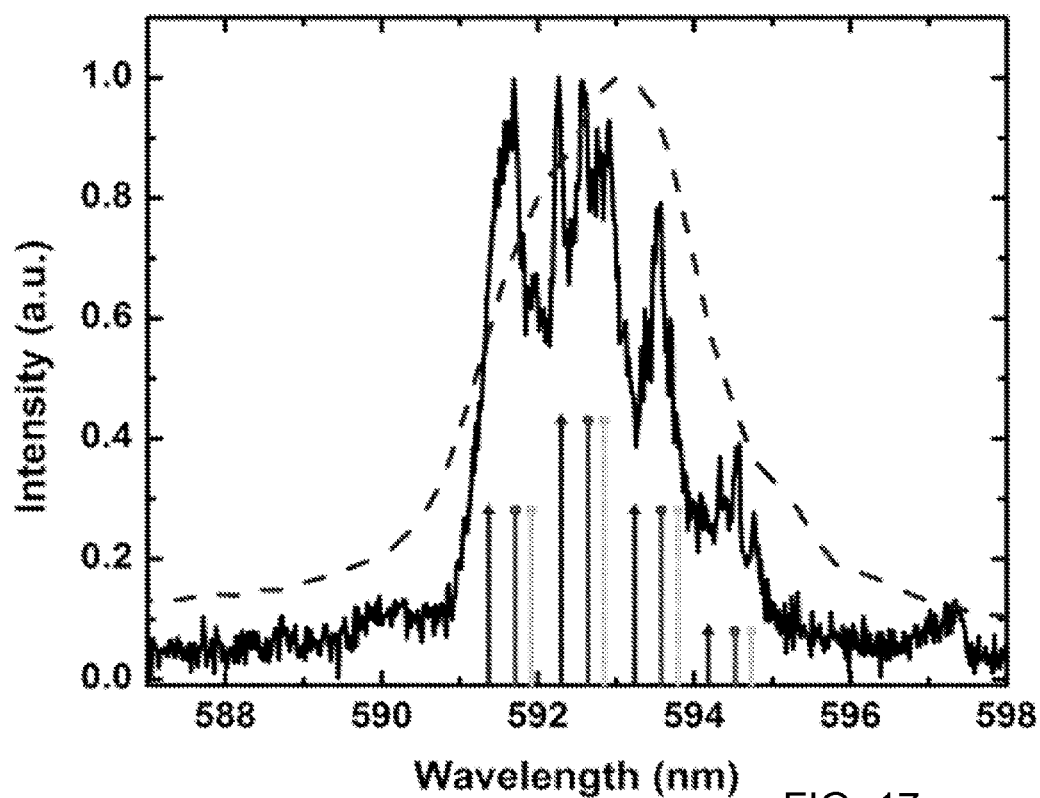
FIG. 17 shows the high resolution (solid) and low resolution (dash) spectra for the orange lasing peak of the nanosheet of FIGS. 15A and 15B, and the calculated modal wavelengths of an analogous theoretical nanosheet.

FIG. 15D shows the single pulse PL spectra evolving with increasing pump power density. At lower pumping levels, only broadband spontaneous emission from the CdS-rich and CdSe-rich sections is observed. With increasing pump pulse power, a narrow peak appears at 592 nm at an excitation level of 173 $kW/cm^2$, indicating the onset of lasing for the orange color in the CdSe-rich section. The same is observed for green color lasing at 534 nm in the CdS-rich section when the excitation level reaches 241 $kW/cm^2$. The 58 nm separation of the two lasing peaks is much larger than the gain bandwidth of a typical Zn—Cd—S—Se semiconductor material system including CdS or CdSe. The narrowest linewidths of the two colors in FIG. 15D are around 4 nm, which are significantly broader than the typical linewidth of a single mode semiconductor laser. Detailed examination suggests such broad linewidths of both sections under higher excitation intensities is due to the well-known multimode lasing behavior and spectrometer resolution limitation. We performed high resolution measurement for the orange lasing peak to compare with the low resolution measurement to examine the detailed mode features. FIG. 17 shows the high resolution (solid) and low resolution (dash) spectra for the orange lasing peak at 424 $kW/cm^2$. The vertical lines represent the wavelength of $TE_{10}$ (square), $TE_{20}$ (circle) and $TE_{30}$ (blue) transverse modes. Each transverse mode has 4 associated longitudinal modes. The intensity of vertical lines of each group is calculated by the Gaussian convolution. The high resolution measurement reveals that the wide peak in low resolution measurement actually consists of multiple peaks with individual linewidths as narrow as 0.1-0.3 nm. The multiple lasing peaks can be divided into four groups and each group consists of a series of closely spaced peaks. The four groups of lasing peaks can be identified as the longitudinal modes of different orders with each group consist of several closely spaced transverse modes. The mode spacing between the transverse modes is typically smaller than the longitudinal mode separation and can be as small as 0.2 nm, which almost reaches the resolution limitation of the spectrometer system used in the measurements. The multimode lasing features are attributed to the large size of the nanosheet structures in both directions, as compared to the wavelengths. With increasing pump intensity, more modes are excited above the threshold (see Supplementary Information for another nanowire case). Their close proximity to each other results in broader peaks as observed in low resolution measurements.

Figure 18:
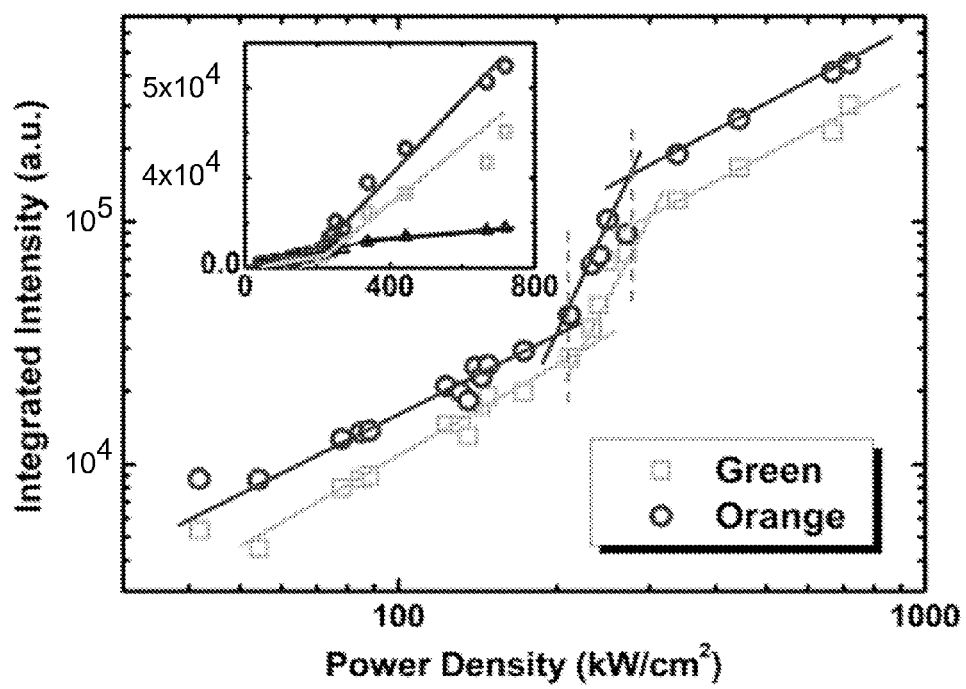
FIG. 18 is a plot of output intensities of the two lasing colors versus pumping power density of the nanosheet of FIGS. 15A and 15B.

The light-in-light-out relations are presented in FIG. 18 on both linear and log-log scales to corroborate the spectral features and to further establish the lasing behavior at two distinct wavelengths. FIG. 18 shows output intensities of the two lasing colors versus pumping power density at 77 K. The inset also shows the saturation of spontaneous emission (triangles). Shown in the inset of FIG. 18, the lasing intensity of both colors increase linearly with pump power after threshold (260 $kW/cm^2$ for the green modes and 230 $kW/cm^2$ for the orange modes). The total spontaneous emission output increases much more slowly than the lasing modes in the high excitation region, demonstrating the typical behavior associated with the lasing threshold. The log-log scale of the lasing output as a function of the excitation power features the well-known S-like behavior with three significantly different regions. At low pumping, the spontaneous emission is dominant, so the mode intensities increase linearly with a slope of 1.1 for orange and 1.3 for green. Around the thresholds, the output intensities of both lasing modes show superlinear increases with slopes of 5.1 for orange and 4.7 for green. With further increase of the excitation power, the slopes of both curves return to 1.1, indicating the above-threshold lasing operation of both colors. The dependence of total intensity on pumping displays a typical threshold behavior of multimode lasing.

Figure 19A:
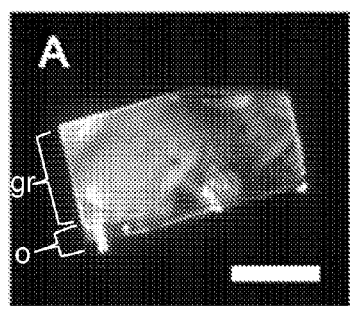
FIG. 19A is a real color photoluminescence image of a nanosheet according to another embodiment of the invention.
Figure 19B:
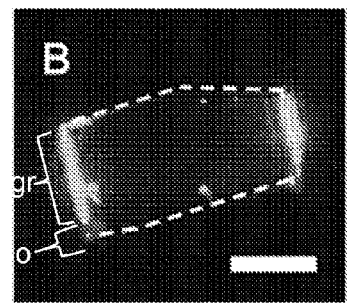
FIG. 19B is a real color photoluminescence image of the nanosheet of FIG. 19A under higher pumping power.
Figure 19C:
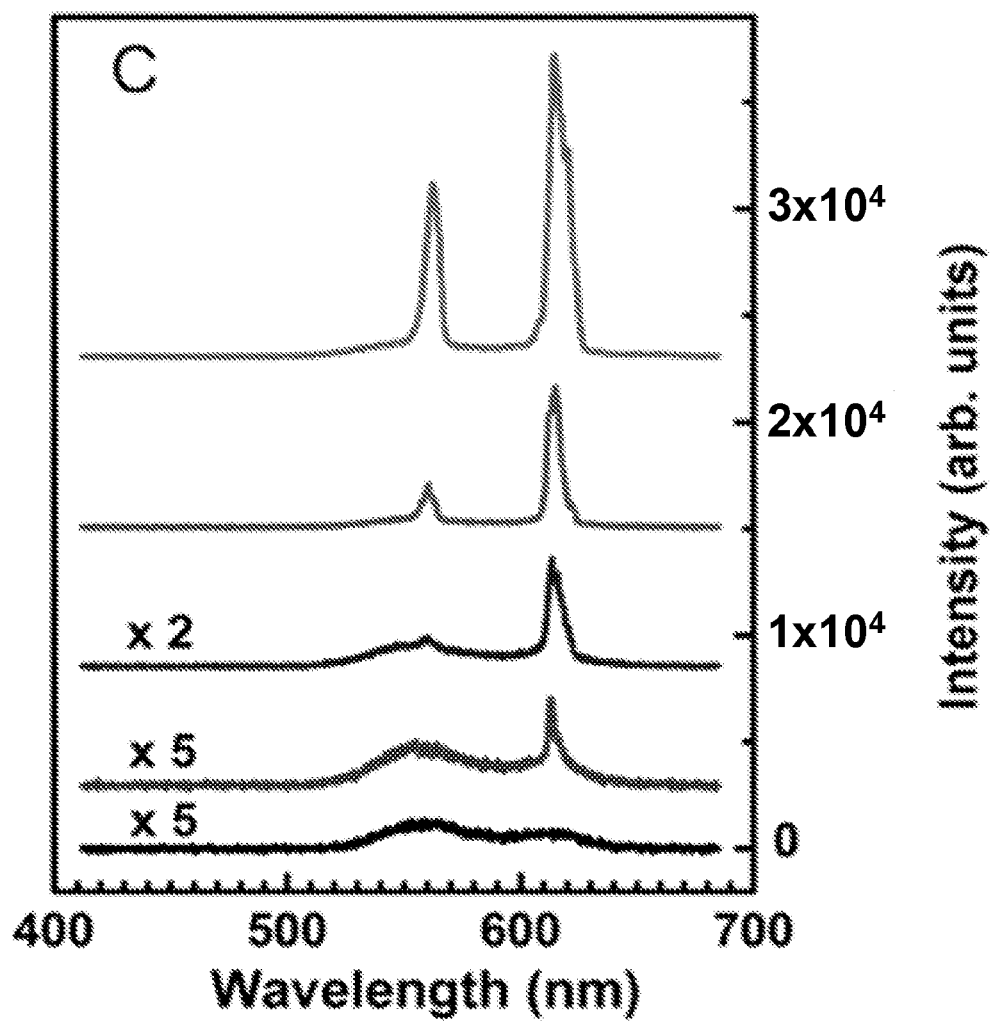
FIG. 19C is the PL spectra at 77K under increasing levels of pumping power density of 77, 173, 241, 338 and 668 kW/cm$^2$ from bottom to top.

In another embodiment, room temperature (RT) lasing has also been achieved on a larger nanosheet (66.5 μm in length, 33.0 μm in width, and 200 nm in thickness). FIG. 19A is a real-color PL image of the nanosheet at RT under low pumping power density. The scale bar is 10 μm. As shown in FIG. 19A, the widths of the green (gr) and the wider orange (o)

stripes are around 30 µm and 3 µm, respectively. The real color lasing image under 667 kW/cm² illumination and PL spectra evolution at increasing power densities of 114, 184, 257, 310 and 546 kW/cm² from bottom to top are shown in FIGS. 19B and 19C, respectively. The lasing wavelengths of the orange and green peaks are 613 nm and 562 nm, respectively, with a wavelength separation of 51 nm. The estimated threshold is 300 kW/cm² for the green modes and 227 kW/cm² for the orange modes. The lasing sequence for the two colors at RT is consistent with the result at 77K, both exhibiting higher thresholds for the green modes than for the orange modes. Other features are also similar.

Figure 13D:
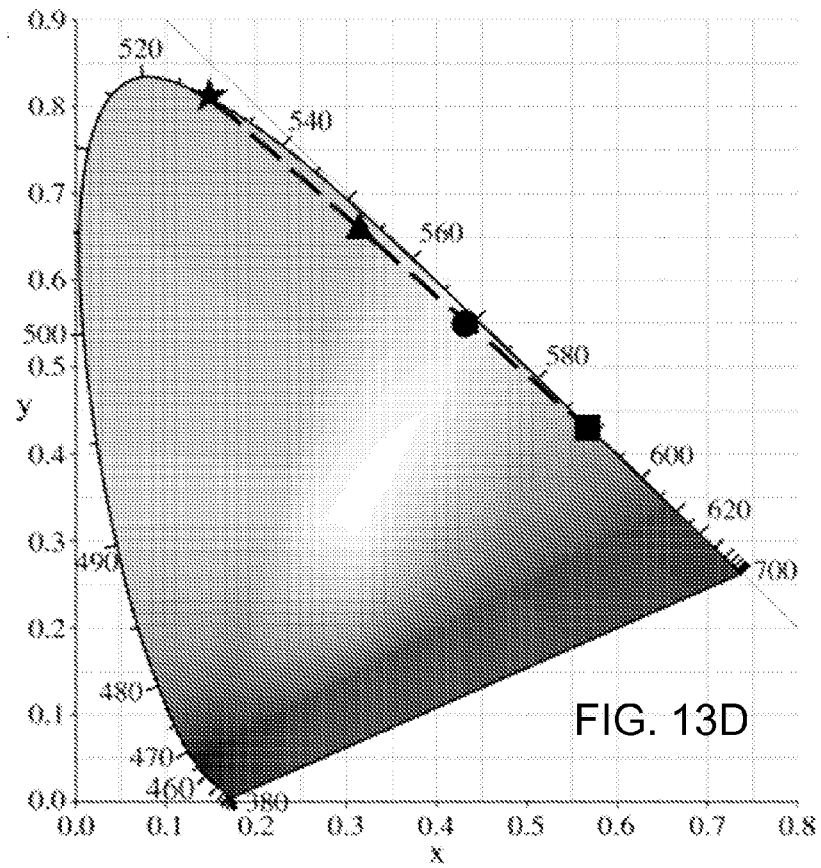
FIG. 13D is a plot of the chromaticity of the spectra of FIG. 13C on the CIE 1931 color space.

As described herein, by mixing shorter and longer-wavelength colors such as green and red, intermediate colors such as yellow-green, yellow and orange etc. can be produced. FIG. 13D shows the CIE-1931 color space, and shows how color mixing works. Generally speaking, mixing any two points in this color map provides a color between the two points (i.e., as observed by an observer).

While certain previously-described embodiments were discussed with respect to two colors, the person of skill in the art will appreciate that similar techniques can be used to provide, for example, devices emitting in three colors. Such devices can, for example, be configured to emit light that appears white.

To achieve white color using two color mixing, the requirement for the two colors are:

$$380 \text{ nm} \leq \lambda_1 \leq 470 \text{ nm}$$

$$570 \text{ nm} \leq \lambda_2 \leq 575 \text{ nm}$$

Figure 20:
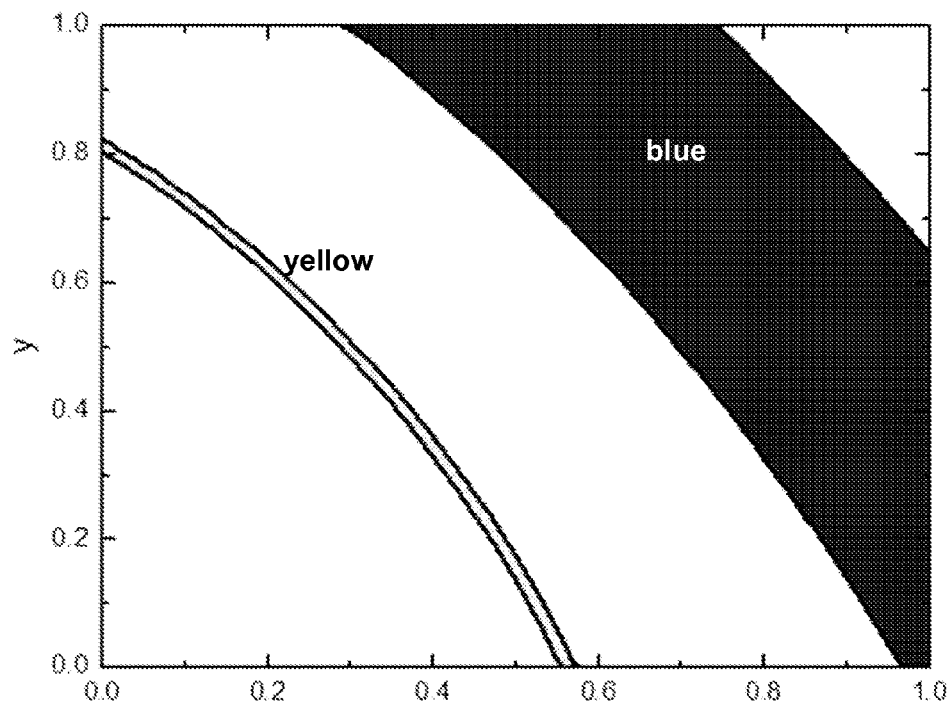
FIG. 20 is a graph showing exemplary $Zn_xCd_{1-x}S_ySe_{1-y}$ quaternary alloy compositions suitable for white color lasers.

The calculation is based on the CIE xyz color space. The white color is defined as x=y=z=⅓. (Here, x, y and z refer to the color space, not the composition.) A white color laser can be based on a $Zn_xCd_{1-x}S_ySe_{1-y}$ material. A possible composition is shown by the graph in FIG. 20. This figure illustrates all the possible range of x and y to achieve white light with two segments of a {ZnCd}{SSe} nanowires. For FIG. 20, if $$f(x, y) = [3.73x + 2.36(1 - x) - 0.301x(1 - x)]y + $$
$$[2.68x + 1.67(1 - x) - 0.612x(1 - x)](1 - y) - 0.432y(1 - y)$$

then, the blue region (rightmost region) represents all the (x,y) that satisfy: 2.64<f(x,y)<3.26; and the yellow region (leftmost region) represents all the (x,y) that satisfy: 2.12<f(x,y)<2.14.

Figure 21:
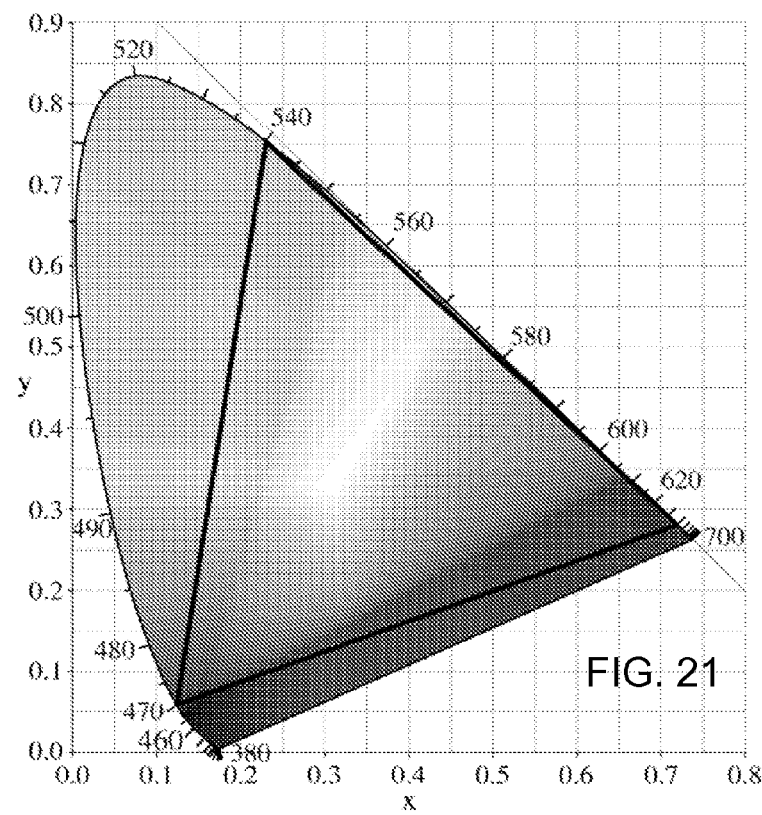
FIG. 21 is a plot of the CIE xyz color space showing certain three single wavelength color mixing for providing white light emission.
Figure 22:
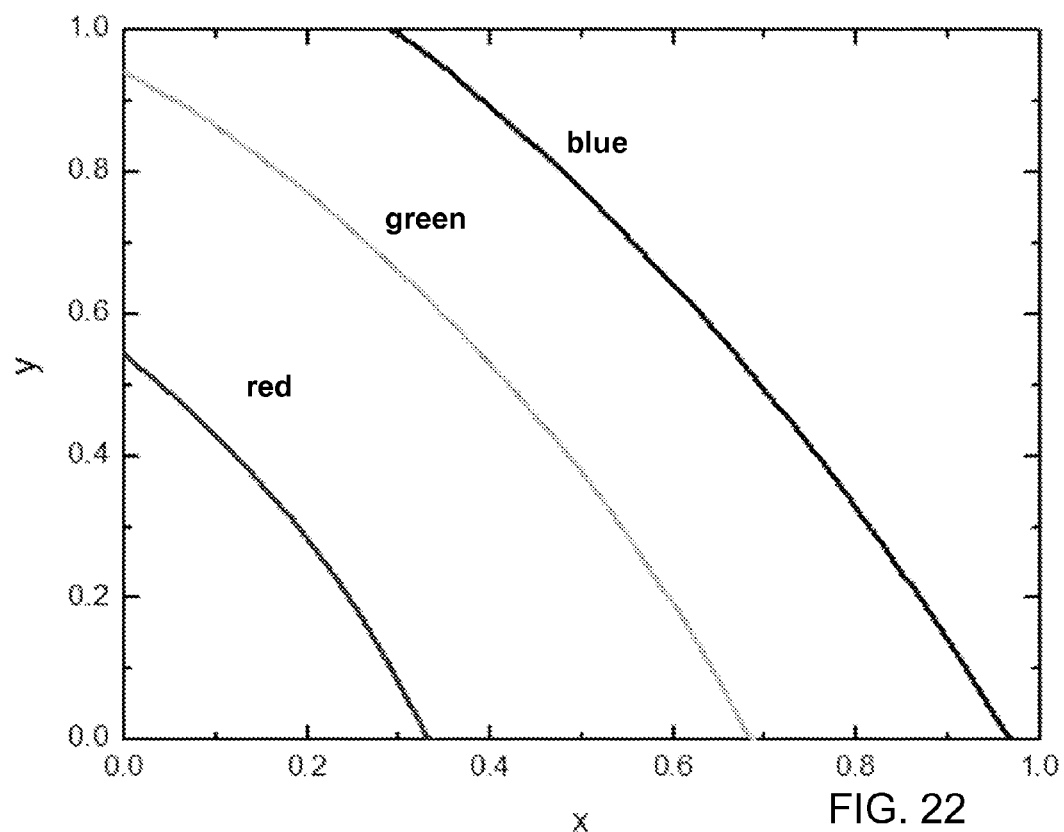
FIG. 22 is graph showing exemplary $Zn_xCd_{1-x}S_ySe_{1-y}$ quaternary alloy composition for mixing 470 nm, 540 nm and 640 nm wavelengths for providing white light emission.

As an example of three color mixing, according to the CIE xyz color space, the possible colors by mixing three single wavelength lasing are shown in FIG. 21, for the three single wavelengths 470 nm, 540 nm and 640 nm. The colors in the black triangle can be achieved by a three-segment laser. An example of a three segment laser is based on the $Zn_xCd_{1-x}S_ySe_{1-y}$ semiconductor compositions as shown in FIG. 22. If $$f(x, y) = [3.73x + 2.36(1 - x) - 0.301x(1 - x)]y + $$
$$[2.68x + 1.67(1 - x) - 0.612x(1 - x)](1 - y) - 0.432y(1 - y)$$

then, the blue curve (rightmost curve) represents all the (x,y) that satisfy f(x,y)=2.64; the green curve (center curve) represents all the (x,y) that satisfy f(x,y)=2.30; and the red curve (leftmost curve) represents all the (x,y) that satisfy f(x,y)=1.94.

The person of skill in the art will be able to determine the gain requirements of the devices and methods described herein. For example, for certain material systems the refractive index of all materials can be assumed to be about 2.6 (the average refractive index of ZnS, CdS and CdSe at 630 nm). If the gain material length is assumed to be 50 µm, the loss from two mirrors is assumed to be 650 cm⁻¹ and the confinement factor is more than 95%, then the minimum gain requirement for the whole wire cavity (straight part) can be about 680 cm⁻¹. If the junction coupling is assumed to be 0.2 (i.e., between looped and straight portions) and the length of the looped circle is assumed to be 50 µm and the confinement factor is 95%, then the minimum gain requirement for the looped cavity is 340 cm⁻¹.

Accordingly, the semiconductor nanostructures, devices and methods described herein can provide a number of advantages, including small device size, flexible lasing colors, and active color tunability in an extremely wide range compared to the gain bandwidth of a single semiconductor. Moreover, the semiconductor nanostructures, devices and methods described herein can simultaneously overcome two fundamental challenges of multicolor lasing—material growth and cavity design. Accordingly, semiconductor nanostructures, devices and methods described herein can be useful in various applications including photonic integrated circuits, small size white color lasers, on-chip laser display, white lasers for lighting and illumination, display applications, and any other situations where dynamic color control is desired.

The present invention is illustrated by way of the foregoing description and examples. The foregoing description is intended as a non-limiting illustration, since many variations will become apparent to those skilled in the art in view thereof. It is intended that all such variations within the scope and spirit of the appended claims be embraced thereby. Each referenced document herein is incorporated by reference in its entirety for all purposes.

Changes can be made in the composition, operation and arrangement of the method of the present invention described herein without departing from the concept and scope of the invention as defined in the following claims.

We claim:

1. A method of generating radiation, comprising directing energy as a pumping source at a semiconductor nanowire, nanobelt or nanosheet, the semiconductor nanowire, nanobelt or nanosheet being formed from a II-VI semiconductor material system, a III-V semiconductor material system, or a IV-VI semiconductor material system, a composition of the semiconductor nanowire, nanobelt or nanosheet varying along a dimension thereof, the energy being directed at a first position of the semiconductor nanowire, nanobelt or nanosheet, the energy being adapted to pump the semiconductor material of the nanowire, nanobelt or nanosheet at the first position thereof, wherein the method further comprises substantially simultaneously directing energy as pumping source at the semiconductor nanowire, nanobelt or nanosheet at a second position thereof, the energy being adapted to pump the semiconductor material of the nanowire, nanobelt or nanosheet at the first position thereof, the second position being different than the first position, the semiconductor material of the nanowire, nanobelt or nanosheet at the second position being different than the semiconductor material of the nanowire, nanobelt or nanosheet at the first position.

2. The method according to claim 1, wherein the bandgap emission wavelength of the semiconductor material at the first position is longer than the bandgap emission wavelength of the semiconductor material at the second position, and wherein the second position is disposed in a loop.

3. The method according to claim 1, wherein the semiconductor nanowire, nanobelt or nanosheet is formed from a II-VI semiconductor material system.

4. The method according to claim 3, wherein the II-VI semiconductor material system is {ZnCd}{SSe} or {Cd}{SSe}.

5. The method according to claim 1, wherein the semiconductor nanowire, nanobelt or nanosheet is formed from a III-V semiconductor material system.

6. The method according to claim 5, wherein the III-V semiconductor material system is {AlIn}{GaN}.

7. The method according to claim 1, wherein the semiconductor nanowire, nanobelt or nanosheet is formed from a IV-VI semiconductor material system.

8. The method according to claim 1, wherein the semiconductor nanowire, nanobelt or nanosheet comprises a plurality of linearly situated segments disposed along the dimension, each segment having a different composition, each segment having a different band gap, the segments being arranged in order along the dimension of the nanowire, nanobelt or nanosheet from smallest to largest band gap.

9. The method according to claim 1, wherein the semiconductor nanowire, nanobelt or nanosheet comprises a plurality of linearly situated segments disposed along the dimension, each segment having a different composition, each segment having a different band gap, the segments being arranged in order along the dimension of the nanowire, nanobelt or nanosheet from smallest to largest band gap, and wherein the first position is within one of the segments, and the second position is within another of the segments.

10. The method according to claim 8, wherein two adjacent segments are separated by a transition region, in which the semiconductor composition varies from the composition of one segment to the composition of the next segment.

11. The method according to claim 8, wherein the semiconductor nanowire, nanobelt or nanosheet comprises two segments, wherein the first segment comprises CdS and the second segment comprises CdSe.

12. The method according to claim 8, wherein the semiconductor nanowire, nanobelt or nanosheet comprises two segments, wherein the first segment comprises $CdS_xSe_{1-x}$ and the second segment comprises $CdS_ySe_{1-y}$, wherein x and y are each greater than 0 and less than 1, and x and y are not the same.

13. The method according to claim 8, wherein the semiconductor nanowire, nanobelt or nanosheet comprises three segments, wherein each segment comprises an alloy of the formula $Zn_xCd_{1-x}S_ySe_{1-y}$, wherein x and y are each greater than equal to 0 and less than or equal to 1.

14. The method according to claim 1, comprising directing energy at one or more segments of the nanowire, nanobelt or nanosheet to provide a first emission profile, then directing energy at one or more segments of the nanowire, nanobelt or nanosheet to provide a second emission profile different from the first.

15. The method according to claim 1, comprising selecting a desired emission profile, then directing energy at one or more segments of semiconductor nanowires, nanosheets or nanobelts to provide the selected emission profile.

16. A light emitting device comprising a semiconductor nanowire, nanobelt or nanosheet, the semiconductor nanowire, nanobelt or nanosheet being formed from a II-VI semiconductor material system, a III-V semiconductor material system, or a IV-VI semiconductor material system, a composition of the semiconductor nanowire, nanobelt or nanosheet varying along a dimension thereof, further comprising:
a first energy source, configured to pump the semiconductor material of the nanowire, nanobelt or nanosheet at a first position of the nanowire, nanobelt or nanosheet; and
a second energy source, configured to pump the semiconductor material of the nanowire, nanobelt or nanosheet at a second position of the nanowire, the second position being different than the first, the semiconductor material of the nanowire, nanobelt or nanosheet at the second position being different than the semiconductor material of the nanowire, nanobelt or nanosheet at the first position.

17. The light emitting device according to claim 16, wherein the second energy source is configured to pump the semiconductor nanowire, nanobelt or nanosheet at a second position thereof substantially simultaneously with pumping the semiconductor nanowire, nanobelt or nanosheet at a first position thereof with the first energy source, the energy being adapted to pump the semiconductor material of the nanowire, nanobelt or nanosheet at the first position thereof, the second position being different than the first position, the semiconductor material of the nanowire, nanobelt or nanosheet at the second position being different than the semiconductor material of the nanowire, nanobelt or nanosheet at the first position.

18. A semiconductor nanowire or nanobelt formed from a II-VI semiconductor material system, a III-V semiconductor material system, or a IV-VI semiconductor material system, a composition of the semiconductor nanowire, nanobelt or nanosheet varying along a dimension thereof, wherein a bandgap emission wavelength of the semiconductor material at the first position is longer than a bandgap emission wavelength of the semiconductor material at the second position, and wherein the second position is disposed in a loop.

* * * * *